United States Patent
Roedlmeier et al.

(10) Patent No.: US 11,271,158 B2
(45) Date of Patent: Mar. 8, 2022

(54) ELECTRONIC AND OPTOELECTRONIC DEVICES HAVING ANISOTROPIC PROPERTIES AND METHOD FOR THEIR PRODUCTION

(71) Applicant: InnovationLab GmbH, Heidelberg (DE)

(72) Inventors: Tobias Roedlmeier, Heidelberg (DE); Anthony Morfa, Bruchsal (DE); Gerardo Hemandez-Sosa, Heidelberg (DE); Ralph Eckstein, Heidelberg (DE)

(73) Assignee: InnovationLab GmbH, Heidelberg (DE)

( * ) Notice: Subject to any disclaimer, the term of this patent is extended or adjusted under 35 U.S.C. 154(b) by 0 days.

(21) Appl. No.: 16/615,739

(22) PCT Filed: May 18, 2018

(86) PCT No.: PCT/EP2018/063034
§ 371 (c)(1),
(2) Date: Nov. 21, 2019

(87) PCT Pub. No.: WO2018/215319
PCT Pub. Date: Nov. 29, 2018

(65) Prior Publication Data
US 2020/0106016 A1    Apr. 2, 2020

(30) Foreign Application Priority Data
May 22, 2017    (EP) .................................... 17172156

(51) Int. Cl.
*H01L 51/00*    (2006.01)
*C09D 11/52*    (2014.01)
(Continued)

(52) U.S. Cl.
CPC .......... *H01L 51/0005* (2013.01); *C09D 11/52* (2013.01); *H01L 51/0036* (2013.01);
(Continued)

(58) Field of Classification Search
CPC ... H01M 10/0562; H01M 4/483; H01L 51/00; H01L 51/0036; H01L 51/0508; H01L 51/42
See application file for complete search history.

(56) References Cited

U.S. PATENT DOCUMENTS

| | | | |
|---|---|---|---|
| 2008/0170982 A1* | 7/2008 | Zhang | D01F 9/1273 423/447.3 |
| 2009/0194763 A1* | 8/2009 | Mino | C30B 29/54 257/40 |

(Continued)

FOREIGN PATENT DOCUMENTS

| | | |
|---|---|---|
| WO | 9739045 A1 | 10/1997 |
| WO | 0053656 A1 | 9/2000 |

(Continued)

OTHER PUBLICATIONS

Brinkmann, et al., "Orientation of Regioregular Poly(3-hexylthiophene) by Directional Solidification: A Simple Method to Reveal the Semicrystalline Structure of a Conjugated Polymer", Advanced Materials, vol. 18, Issue 7, Mar. 6, 2006, pp. 860-863.

(Continued)

*Primary Examiner* — Tabassom Tadayyon Eslami
(74) *Attorney, Agent, or Firm* — Armstrong Teasdale LLP

(57) ABSTRACT

Described herein is a method for the production of electronic or optoelectronic devices with an anisotropic molecular structure of an organic semiconductor material. Also described herein are electronic or optoelectronic devices including an organic semiconductor material with anisotropic molecular structure. Also described herein are fibers (Continued)

comprising a hollow core and a shell comprising an organic semiconductor material.

9 Claims, 4 Drawing Sheets

(51) Int. Cl.
   *H01L 51/05* (2006.01)
   *H01L 51/42* (2006.01)
   *H01L 51/50* (2006.01)

(52) U.S. Cl.
   CPC .......... *H01L 51/0508* (2013.01); *H01L 51/42* (2013.01); *H01L 51/50* (2013.01)

(56) References Cited

U.S. PATENT DOCUMENTS

| | | | |
|---|---|---|---|
| 2011/0180787 A1 | 7/2011 | Cho et al. | |
| 2012/0283377 A1 | 11/2012 | Grenier | |
| 2014/0001411 A1* | 1/2014 | Blouin | C08G 61/124 |
| | | | 252/501.1 |
| 2017/0167984 A1* | 6/2017 | Bosse | G01N 21/64 |

FOREIGN PATENT DOCUMENTS

| | | |
|---|---|---|
| WO | 03048225 A2 | 6/2003 |
| WO | 2004022626 A1 | 3/2004 |
| WO | 2005014688 A2 | 2/2005 |
| WO | 2005055248 A2 | 6/2005 |

OTHER PUBLICATIONS

Brinkmann, et al., "Effect of Molecular Weight on the Structure and Morphology of Oriented Thin Films of Regioregular Poly(3-hexylthiophene) Grown by Directional Epitaxial Solidification", Advanced Functional Materials, vol. 17, Issue 1, Nov. 29, 2006, pp. 101-108.

Brinkmann, "Directional Epitaxial Crystallization and Tentative Crystal Structure of Poly(9,9'-di-n-octyl-2,7-fluorene)", Macromolecules, vol. 40, Issue 21, Sep. 12, 2007, pp. 7532-7541.

Dorling, et al., "Uniaxial macroscopic alignment of conjugated polymer systems by directional crystallization during blade coating", Journal of Materials Chemistry C, vol. 2, Issue 17, 2014, pp. 3303-3310.

European Search Report for EP Patent Application No. 17172156.6, dated Nov. 9, 2017, 3 pages.

Muller, et al., "One-Step Macroscopic Alignment of Conjugated Polymer Systems by Epitaxial Crystallization during Spin-Coating", Advanced Functional Materials, vol. 23, Issue 19, Jan. 3, 2013, pp. 2368-2377.

Wittmann, et al., "Epitaxial crystallization of aliphatic polyesters on trioxane and various aromatic hydrocarbons", Journal of Polymer Science: Polymer Physics Edition, vol. 19, Issue 12, Dec. 1981, pp. 1853-1864.

Wittmann, et al., "Epitaxial crystallization of polyethylene on organic substrates: A reappraisal of the mode of action of selected nucleating agents", Journal of Polymer Science: Polymer Physics Edition, vol. 19, Issue 12, Dec. 1981, pp. 1837-1851.

International Search Report and Written Opinion for International Application No. PCT/EP2018/063034, dated Jun. 21, 2018, 9 pages.

\* cited by examiner

ELECTRONIC AND OPTOELECTRONIC DEVICES HAVING ANISOTROPIC PROPERTIES AND METHOD FOR THEIR PRODUCTION

CROSS-REFERENCE TO RELATED APPLICATIONS

This application is a U.S. National Phase Application of PCT/EP2018/063034, filed on May 18, 2018, which claims the benefit of priority to European Patent Application Number 17172156.6, filed May 22, 2017, the entire contents of which are hereby incorporated by reference herein.

TECHNICAL FIELD

The present application relates to a method for the production of electronic or optoelectronic devices with an anisotropic molecular structure of the organic semiconductor material as well as to such electronic or optoelectronic devices comprising an organic semiconductor material with anisotropic molecular structure. The present application further relates to fibers comprising a hollow core and a shell comprising an organic semiconductor material.

BACKGROUND AND DESCRIPTION OF THE PRIOR ART

The macroscopic electronic and optoelectronic properties of organic semiconductor thin films frequently rely on the inherent anisotropy of the molecular structure of the organic semiconductor. This has been found to be reflected in the performance of electronic and optoelectronic devices, such as organic field effect transistors (OTFTs), organic light-emitting diodes (OLEDs), organic photodetectors (OPDs) or organic photovoltaic cells (OPVs). For OTFTs, the current densities and carrier mobilities can differ by orders of magnitude depending on the direction of the charge-carrier transport. In OLEDs the emission efficiency can be strongly dependent on the orientation of the emitter materials. The development of techniques that enable control of the deposition of organic semiconductor materials on the molecular scale is of utmost importance for the optimization of device performance.

The possibility to process organic electronic materials, such as organic semiconductor materials, in solution provides access to industrial coating and printing methods that would permit low-cost high-throughput manufacturing of electronics, also on flexible and transparent substrates. However, such coating and printing methods generally introduce a high degree of disorder in the molecular arrangement in the so-formed films due to the drying of the films, thereby resulting in undesired morphologies (e.g. grain boundaries, glass-like structures, amorphous regions or phase separation).

Research in this field has led to a number of methods leading to high orientation on a molecular level using processes like off-center spin coating, bar coating (e.g. k-bar coating), substrate ribbing, the use of wetting and/or de-wetting structures, mechanical rubbing and shearing, nano-patterning of the processed layer by imprinting or processing with crystalline agents have shown promising results for controlling the orientation of macroscopic films on the molecular level.

Crystallization of conjugated polymer systems, such as organic semiconductor materials, is, for example, disclosed in C. Müller et al., Adv. Funct. Mater. 2013, 23, 2368-2377; B. Dörling et al., J. Mater. Chem. C 2014, 2, 3303-3310; M. Brinkmann, J. C. Wittmann, Adv. Mater. 2006, 18, 860-863; M. Brinkmann, P. Rannou, Adv. Funct. Mater. 2007, 17, 101-108; M. Brinkmann, Macromolecules 2007, 40, 7532-7541; J. C. Wittmann, B. Lotz, Journal of Polymer Science: Polymer Physics Edition, Vol. 19, 1837-1851 (1981); and J. C. Wittmann, B. Lotz, Journal of Polymer Science: Polymer Physics Edition, Vol. 19, 1853-1864 (1981).

However, such process are frequently not compatible or not applicable on an industrial scale or lack the lateral resolution required for the integration of devices in more complex applications (e.g. logical circuits or backplanes).

So as to improve the performance of electronic and optoelectronic devices it is highly desirable that the organic semiconductor materials are present in said devices in a highly ordered structure.

There is therefore a need in industry for a process allowing the deposition of an organic semiconductor material in a highly ordered structure. It is consequently an object of the present application to provide for a process allowing to control the molecular orientation in organic semiconductor thin films. It is a further object of the present application to provide for electronic and/or optoelectronic devices that may be produced on an industrial scale and preferably have anisotropic properties. Furthermore, it Is an object of the present application to provide for a process allowing for the deposition of organic semiconductor material in any geometry and orientation.

SUMMARY OF THE INVENTION

The present inventors have now surprisingly found that the above objects may be attained either individually or in any combination by the vessel and the system of the present application.

The present application therefore provides for a process for the production of electronic or optoelectronic devices comprising the steps of
(a) providing a substrate at a substrate temperature;
(b) providing an ink composition at an ink temperature, said ink composition comprising one or more organic semiconductor material, one or more crystallization agent and one or more solvent; and
(c) applying the ink composition to the substrate by a liquid deposition method to obtain a coated substrate,
    wherein the crystallization agent has a melting temperature equal to or higher than the substrate temperature and a boiling temperature or sublimation temperature equal to or higher than the boiling temperature of the solvent.

The present application also provides for a fiber comprising a hollow core and a shell comprising one or more organic semiconductor material as well as an electronic or optoelectronic device comprising such fibers.

DETAILED DESCRIPTION OF THE INVENTION

Figure 1:
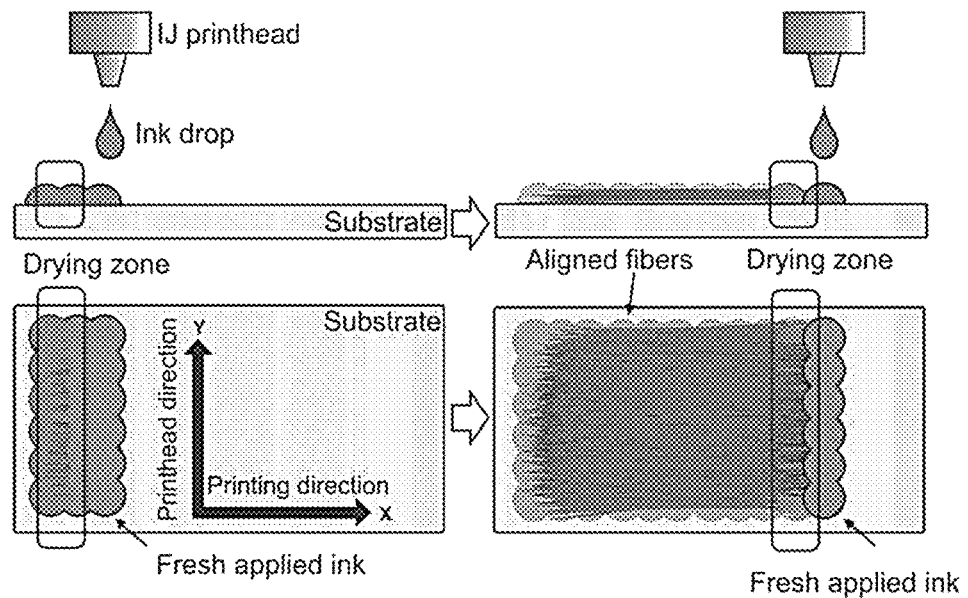
FIG. 1 shows a schematic illustration of an ink-jet printing process.

Generally stated, the present application relates to a method of production of electronic and/or optoelectronic devices, said method comprising the steps of
(a) providing a substrate at a substrate temperature; and
(b) providing an ink composition at an ink temperature.

Substrate

For the purposes of the present application the term "substrate" is generally used to denote a surface or layer onto which subsequently the ink composition is to be applied. Thus, the substrate denotes any layer or surface that may generally be present in an electronic or optoelectronic device, such as, but not limited to, any electrically conductive layer, dielectric layer, passivation layer, self-assembled monolayer, hole transport layer, electron transport layer, hole blocking layer, electron blocking layer, photoconducting layer and light emitting layer. Such layers and the respective materials are generally known to the skilled person and therefore need not be explained in detail.

The substrate temperature is preferably at least 0° C., more preferably at least 10° C., and most preferably at least 15° C.

The substrate temperature is preferably at most 50° C., more preferably at most 40° C., and most preferably at most 30° C.

Ink Composition

The ink composition comprises, preferably consists of, one or more organic semiconductor material, one or more crystallization agent and one or more solvent. Preferably, the ink composition comprises, preferably consists of, an organic semiconductor material, a crystallization agent and a solvent.

The one or more organic semiconductor material and the one or more crystallization agent are preferably comprised in the ink composition in a ratio of organic semiconductor material(s) to crystallization agent(s) of from 1:1 (for example, 1:0.9 or 1:0.8 or 1:0.7 or 1:0.6 or 1:0.5 or 1:0.4) to 1:0.01 (for example, or 1:0.05 or 1:0.10 or 1:0.15).

The amount of solvent comprised in the ink composition is preferably selected so as to adjust ink properties as required by the liquid deposition method for applying the ink composition to the substrate and can easily be determined by the skilled person. The amount of solvent comprised in the ink composition will, for example, depend upon the desired viscosity of the ink as well as the solubility of the organic semiconductor material and/or the crystallization agent therein.

Generally, the concentration of the organic semiconductor material(s) and the crystallization agent(s) in the solution may preferably be at least 0.1% by weight or 0.5% by weight or 1.0% by weight and at most 60% by weight or 50% by weight or 40% by weight or 30% by weight or 20%, with % by weight by weight given relative to the total weight of the solution. Optionally, the solution may also comprise one or more binders to adjust the rheological properties, as described for example in WO 2005/055248 A1.

Organic Semiconducting Material

Preferably the organic semiconductor material is an organic semiconductor polymer.

The type of organic semiconducting material is not particularly limited. In general the organic semiconducting material comprises a conjugated system. The term "conjugated system" is herein used to denote a molecular entity or a part of a molecular entity whose structure may be represented as a system of alternating single and multiple bonds (see also International Union of Pure and Applied Chemistry, Compendium of Chemical Terminology, Gold Book, Version 2.3.3, 2014-02-24, pages 322-323).

An organic semiconducting material suited for use herein may, for example, be represented by the following formula (I)

wherein monomeric unit M and m are as defined herein. At each occurrence M may be selected independently.

For the purposes of the present application, an asterisk "*" is used to denote a linkage to an adjacent unit or group, including for example, in case of a polymer, to an adjacent repeating unit or any other group. In some instances, where specifically identified as such, the asterisk "*" may also denote a mono-valent chemical group.

With regards to formula (I) m may be any integer from 1 to 100,000. For a monomer or monomeric unit m is 1. For an oligomer m is at least 2 and at most 10. For a polymer m is at least 11.

Preferably, the organic semiconducting material comprises one or more aromatic units. Expressed differently, with regards to formula (I) M may be an aromatic unit. Such aromatic units preferably comprise two or more, more preferably three or more aromatic rings. Such aromatic rings may, for example, at each occurrence independently be selected from the group consisting of 5-, 6-, 7- and 8-membered aromatic rings, with 5- and 6-membered rings being particularly preferred.

These aromatic rings comprised in the organic semiconducting material optionally comprise one or more heteroatoms selected from Se, Te, P, Si, B, As, N, O or S, preferably from Si, N, O or S. Further, these aromatic rings may optionally be substituted with alkyl, alkoxy, polyalkoxy, thioalkyl, acyl, aryl or substituted aryl groups, halogen, with fluorine being the preferred halogen, cyano, nitro or an optionally substituted secondary or tertiary alkylamine or arylamine represented by —N(R')(R"), where R' and R" are each independently H, an optionally substituted alkyl or an optionally substituted aryl, alkoxy or polyalkoxy groups are typically employed. Further, where R' and R" is alkyl or aryl these may be optionally fluorinated.

The aforementioned aromatic rings can be fused rings or linked to each other by a conjugated linking group such as —C(T$_1$)=C(T$_2$)-, —C≡C—, —N(R''')—, —N=N—, (R''')=N—, —N=C(R''')—, where T$_1$ and T$_2$ each independently represent H, Cl, F, —C≡N or lower alkyl groups such as C$_{1-4}$ alkyl groups; R''' represents H, optionally substituted alkyl or optionally substituted aryl. Further, where R''' is alkyl or aryl, it may be optionally fluorinated.

Further preferred organic semiconducting materials may be polymers or copolymers wherein the monomeric units M of formula (I) may at each occurrence be independently selected from the group consisting of formulae (A1) to (A83) and (D1) to (D142)
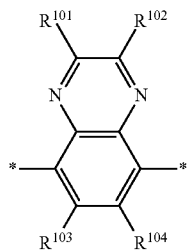
(A1)
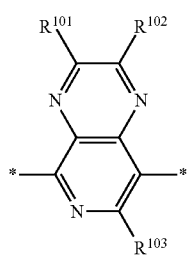
(A2)
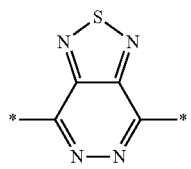
(A3)
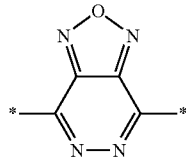
(A4)
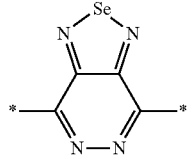
(A5)
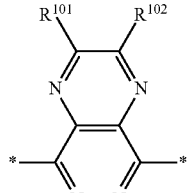
(A6)
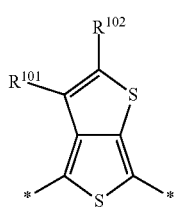
(A7)
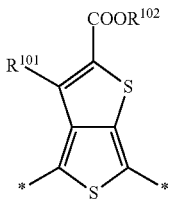
(A8)
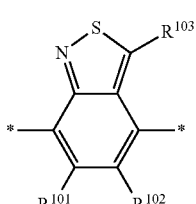
(A9)
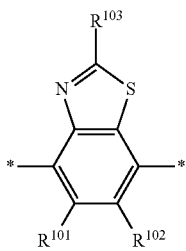
(A10)
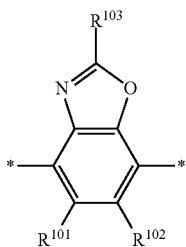
(A11)
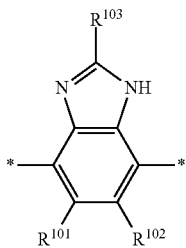
(A12)
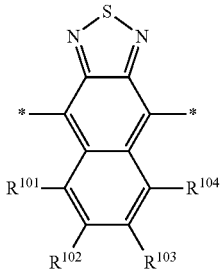
(A13)

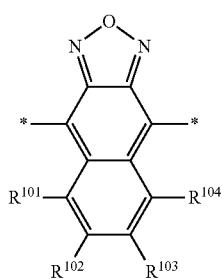 (A14)
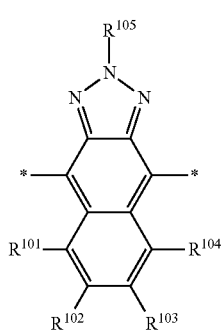 (A15)
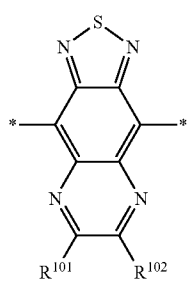 (A16)
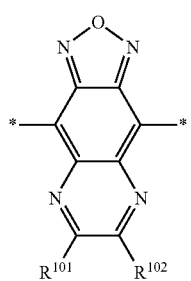 (A17)
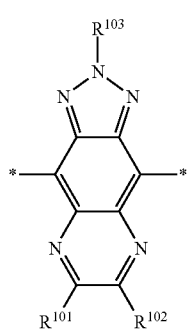 (A18)
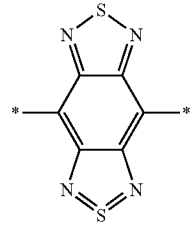 (A19)
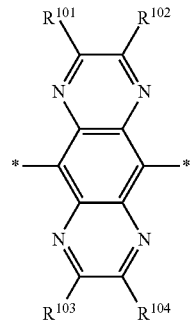 (A20)
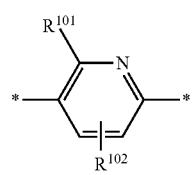 (A21)
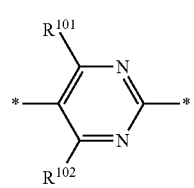 (A22)
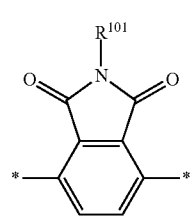 (A23)
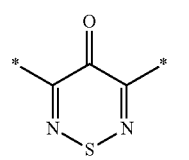 (A24)
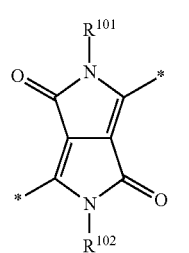 (A25)

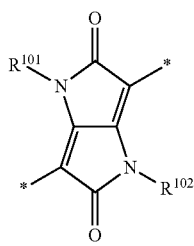 (A26)
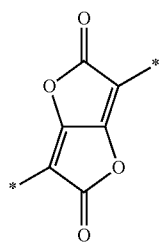 (A27)
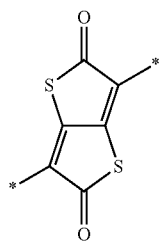 (A28)
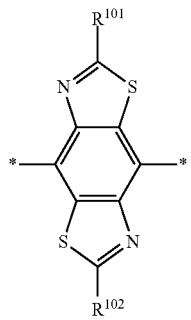 (A29)
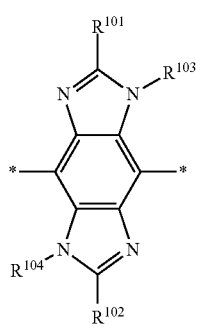 (A30)
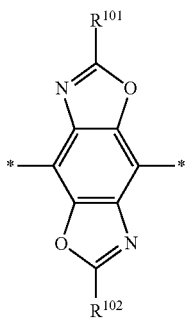 (A31)
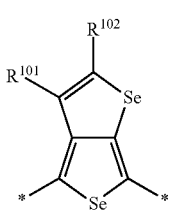 (A32)
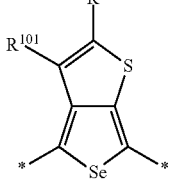 (A33)
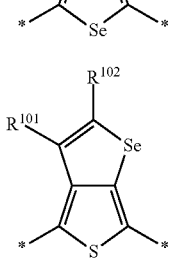 (A34)
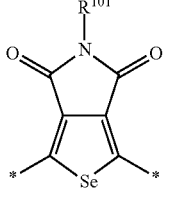 (A35)
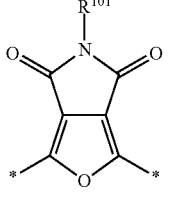 (A36)
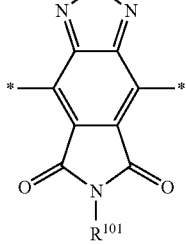 (A37)

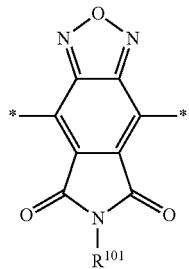 (A38)
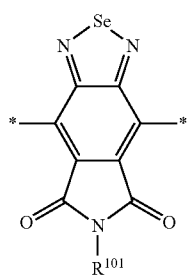 (A39)
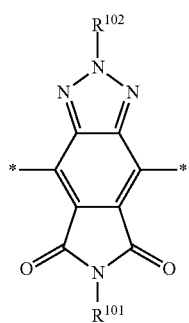 (A40)
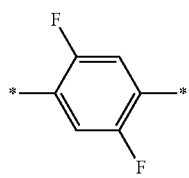 (A41)
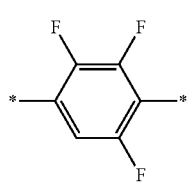 (A42)
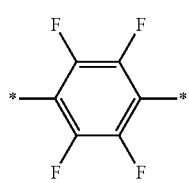 (A43)
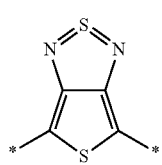 (A44)
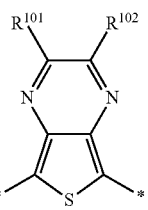 (A45)
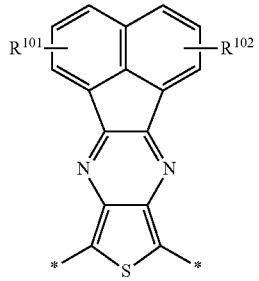 (A46)
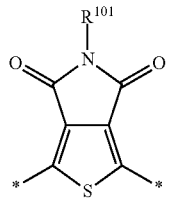 (A47)
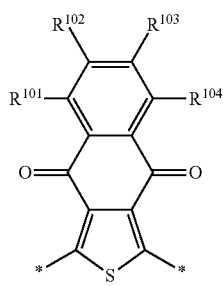 (A48)
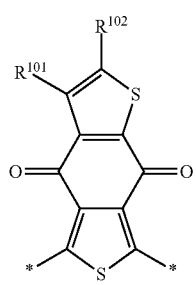 (A49)
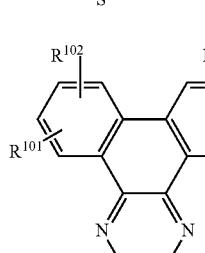 (A50)

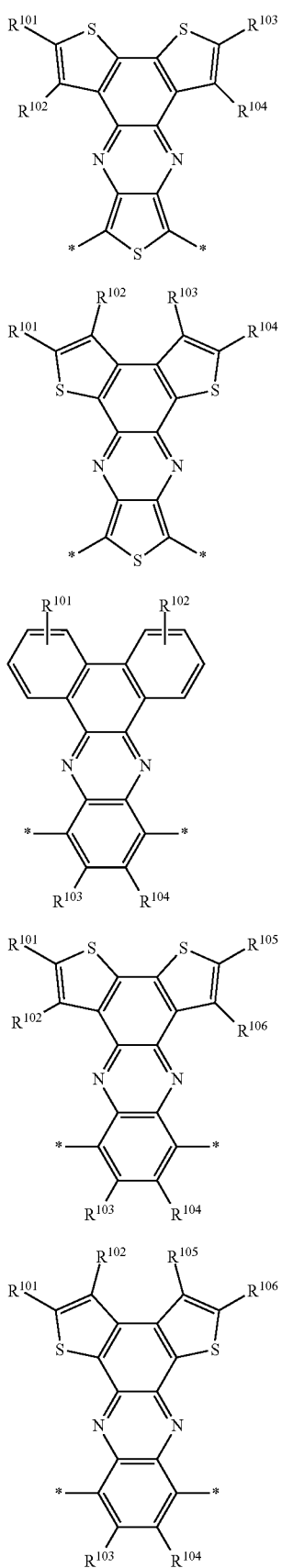
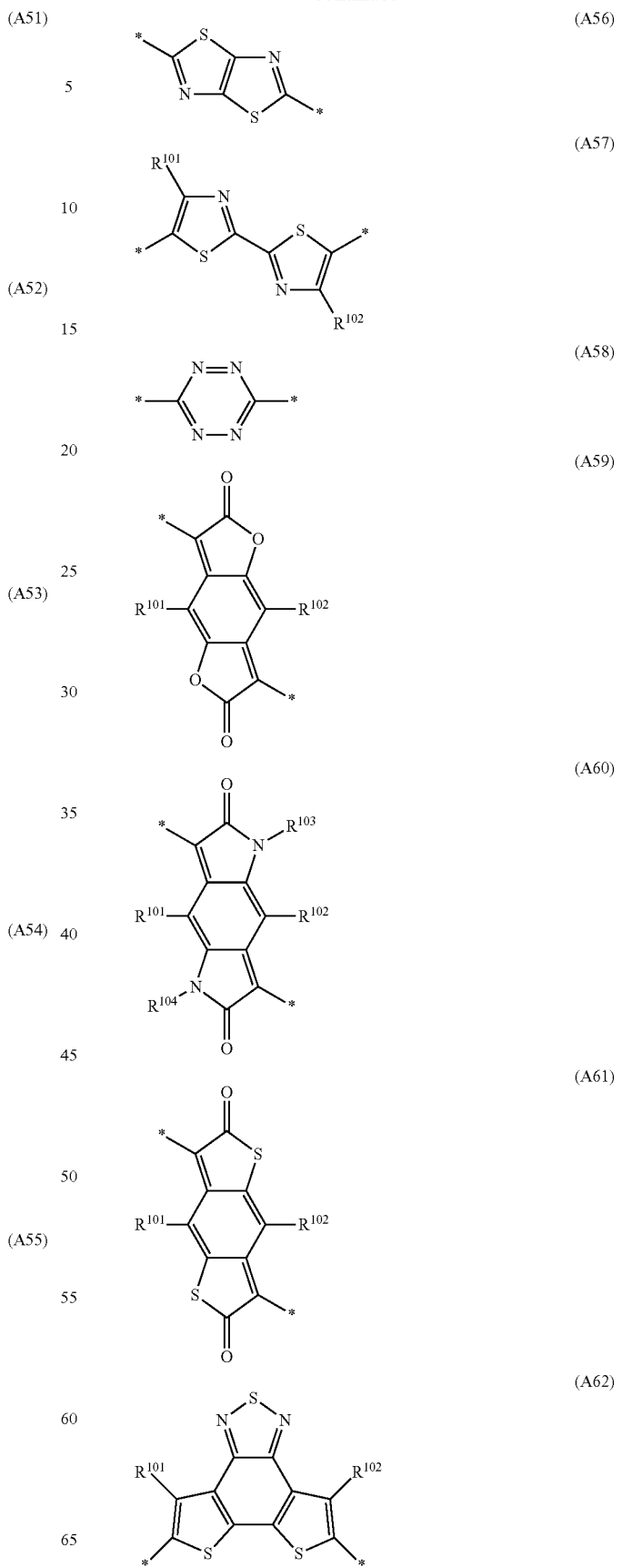

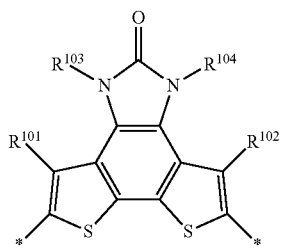
(63)
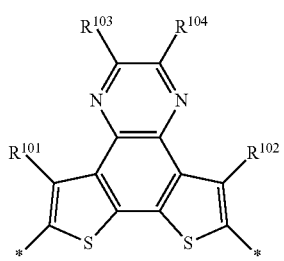
(64)
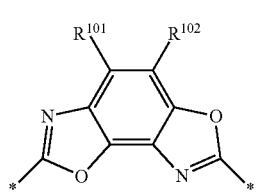
(65)
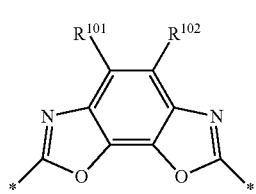
(66)
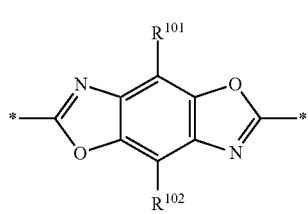
(67)
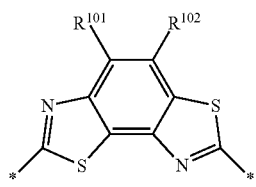
(68)
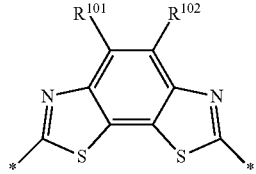
(69)
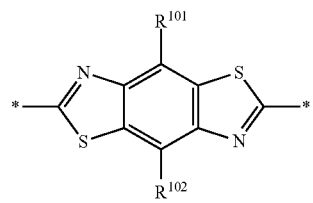
(A70)
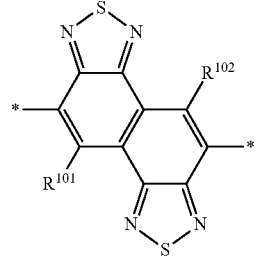
(A71)
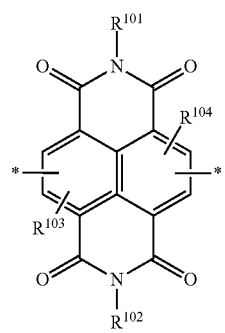
(A72)
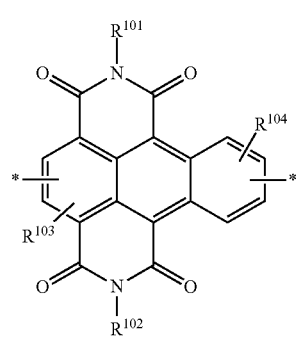
(A73)
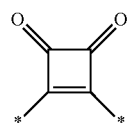
(A74)
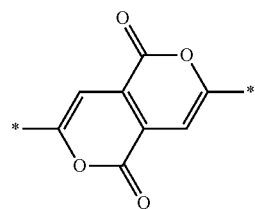
(A75)

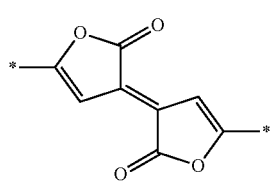 (A76)
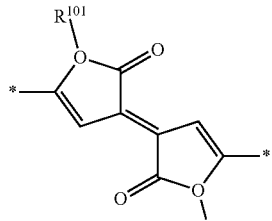 (77)
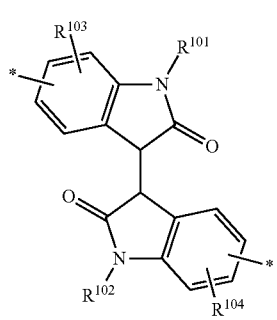 (78)
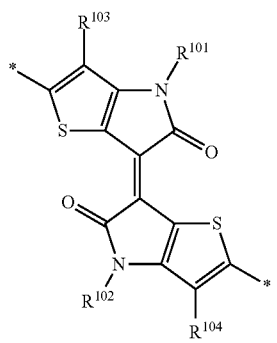 (79)
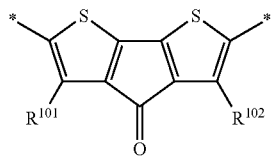 (80)
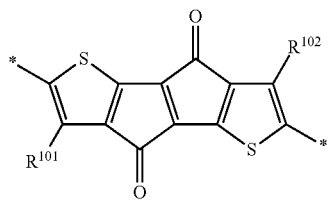 (81)
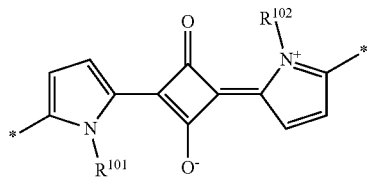 (82)
 (A83)
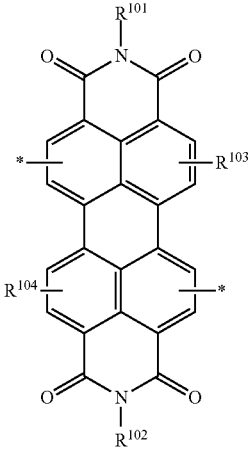
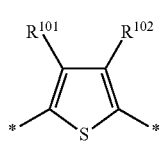 (D1)
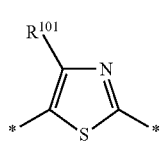 (D2)
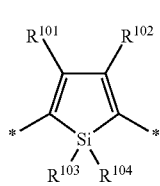 (D3)
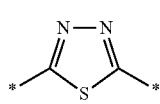 (D4)
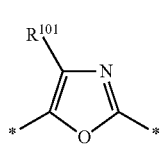 (D5)
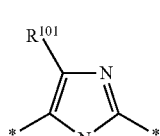 (D6)
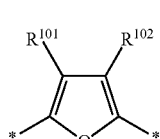 (D7)
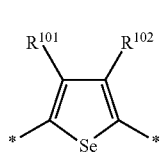 (D8)

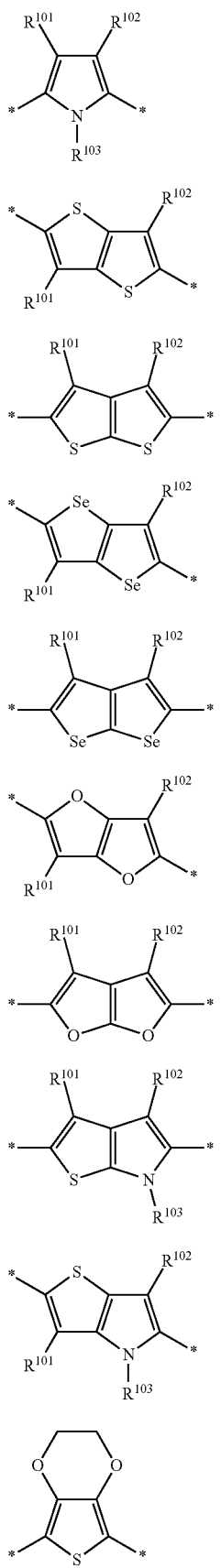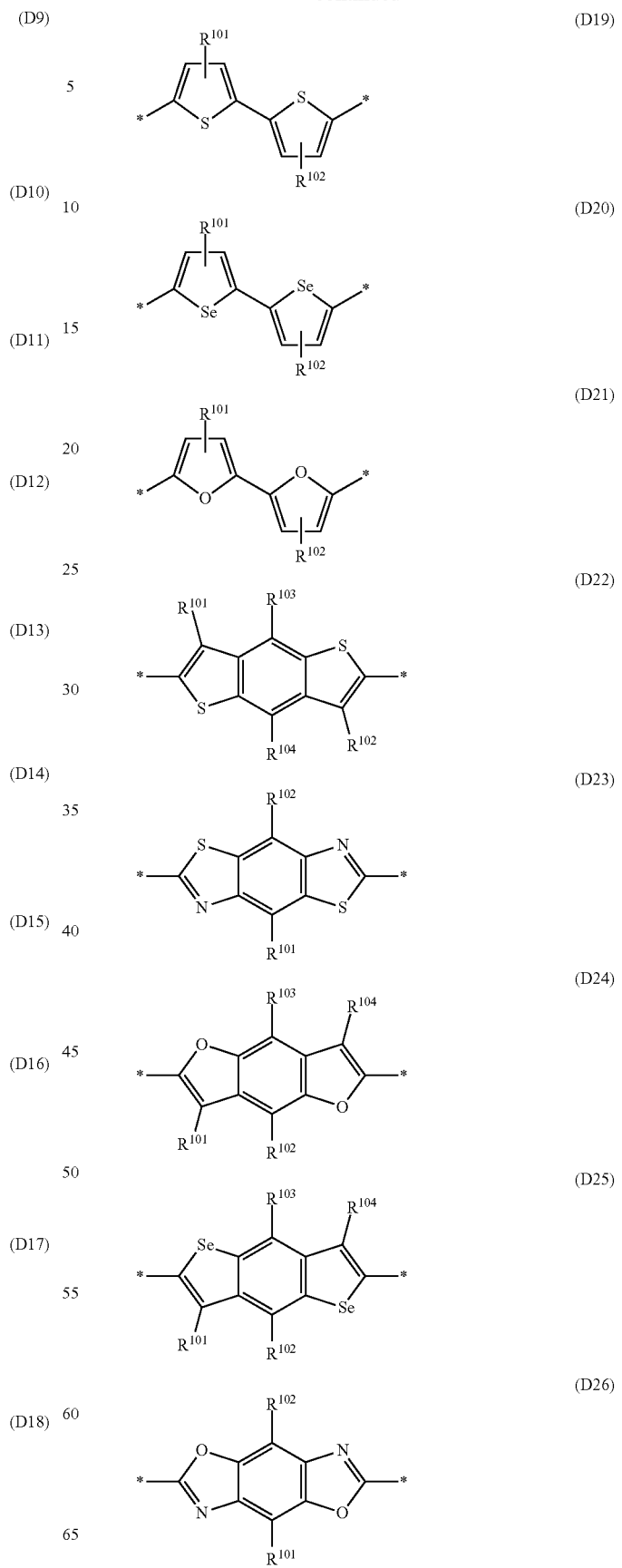

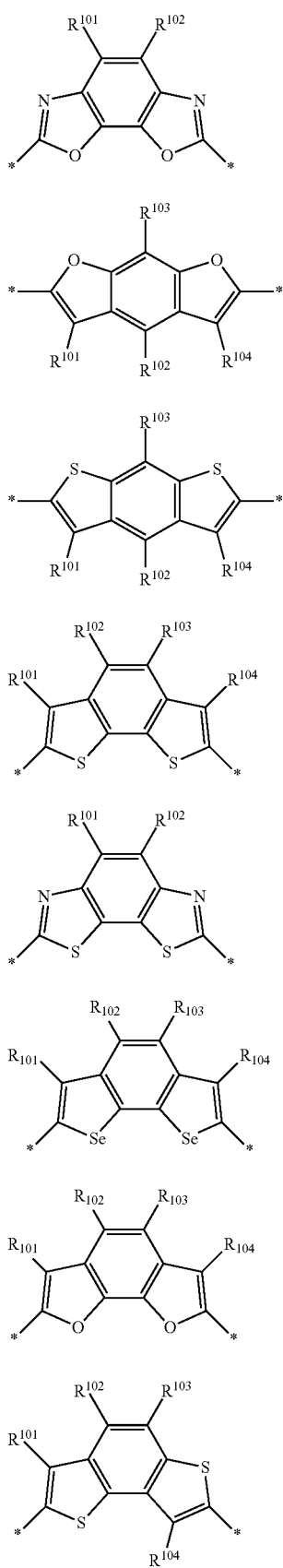
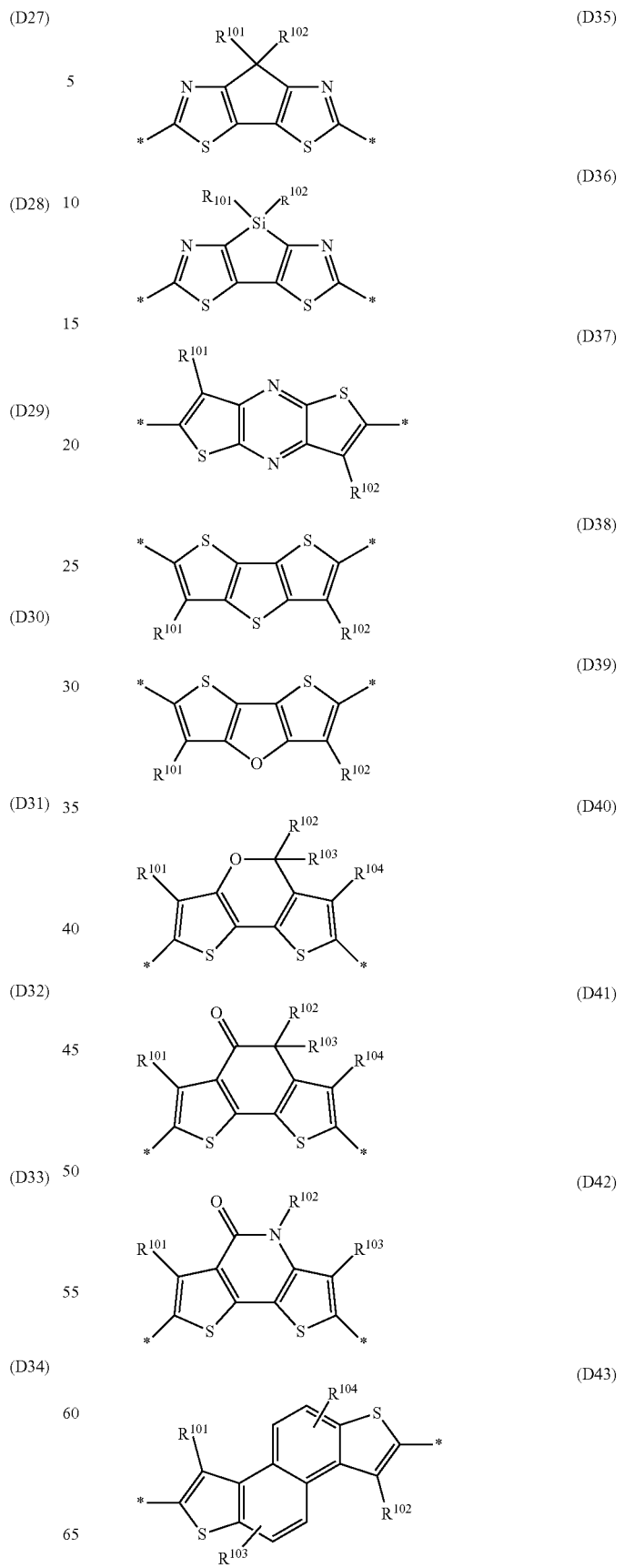

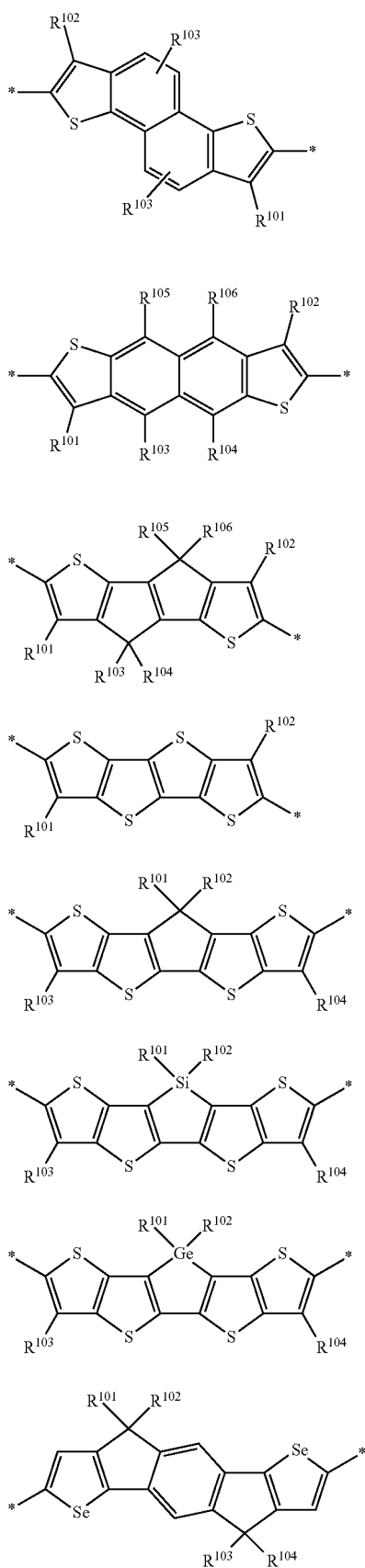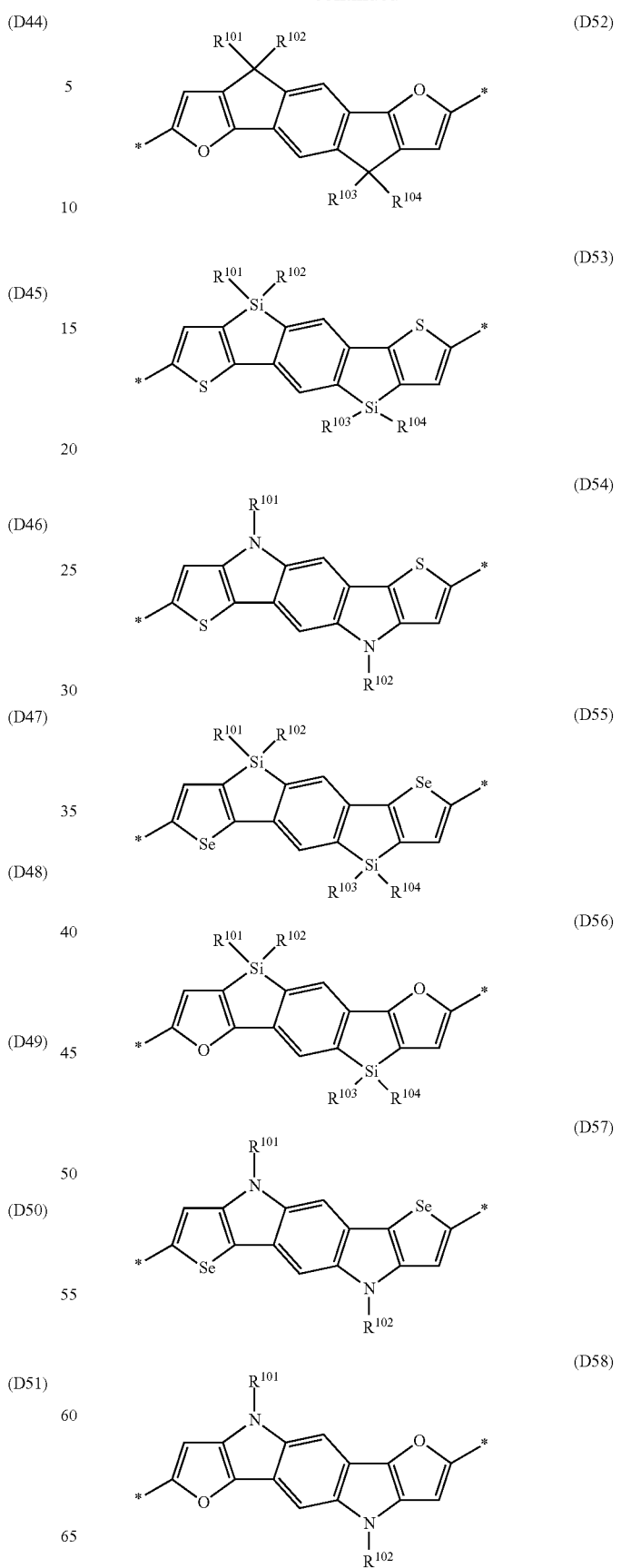

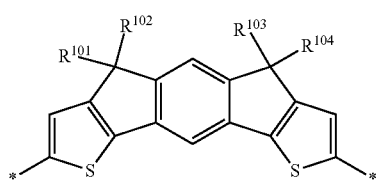
(D59)
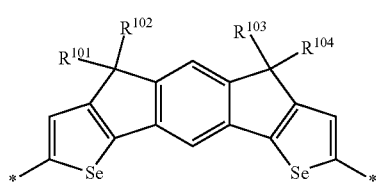
(D60)
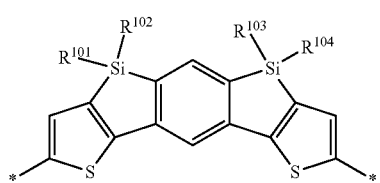
(D61)
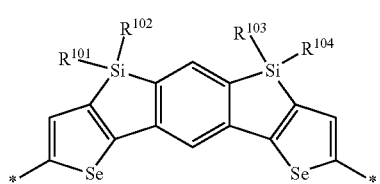
(D62)
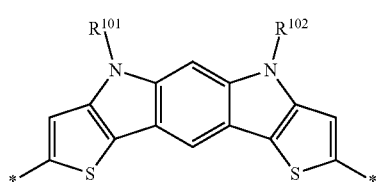
(D63)
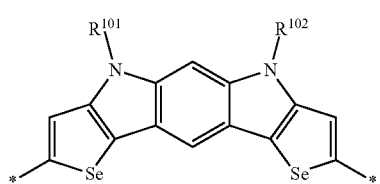
(D64)
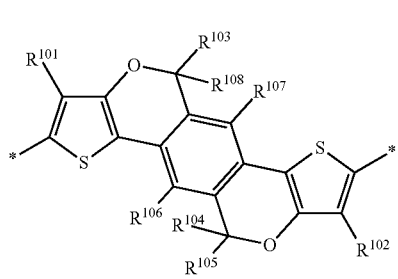
(D65)
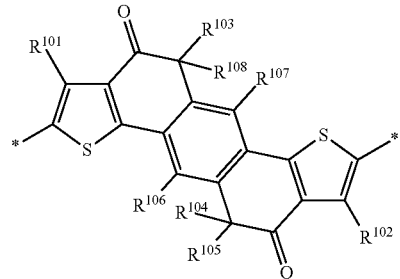
(D66)
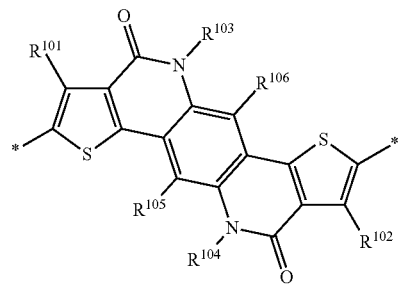
(D67)
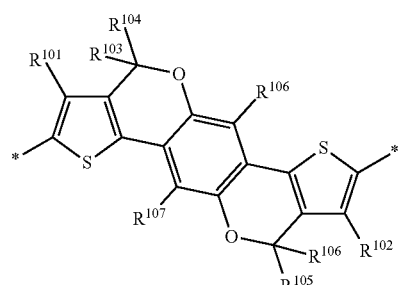
(D68)
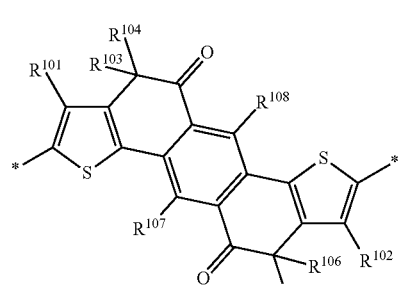
(D69)
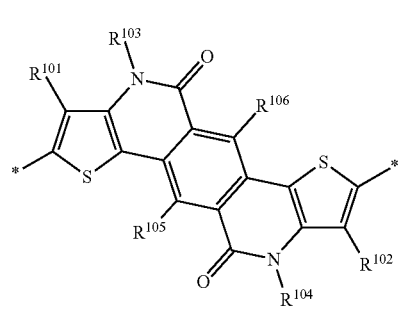
(D70)

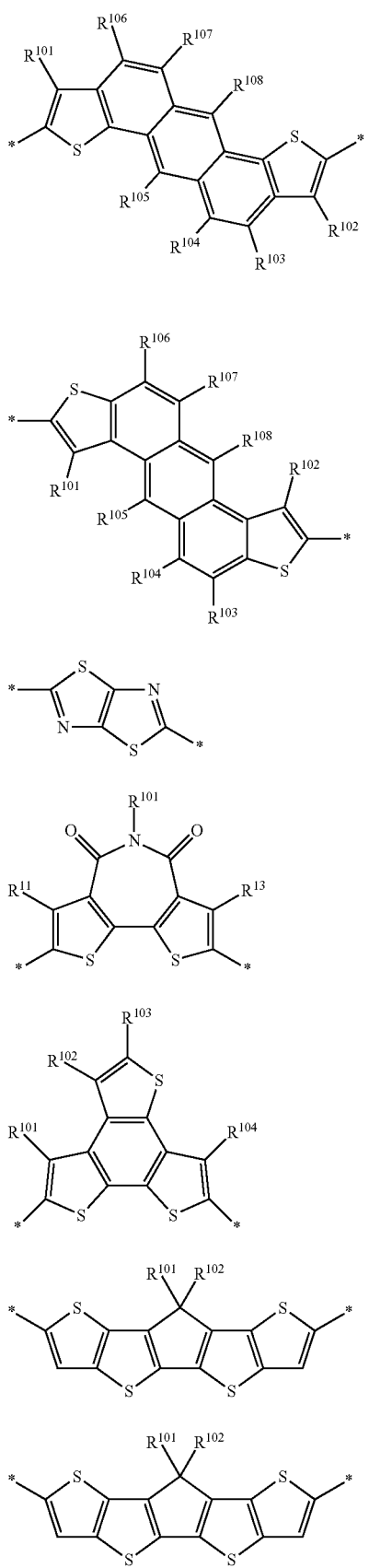
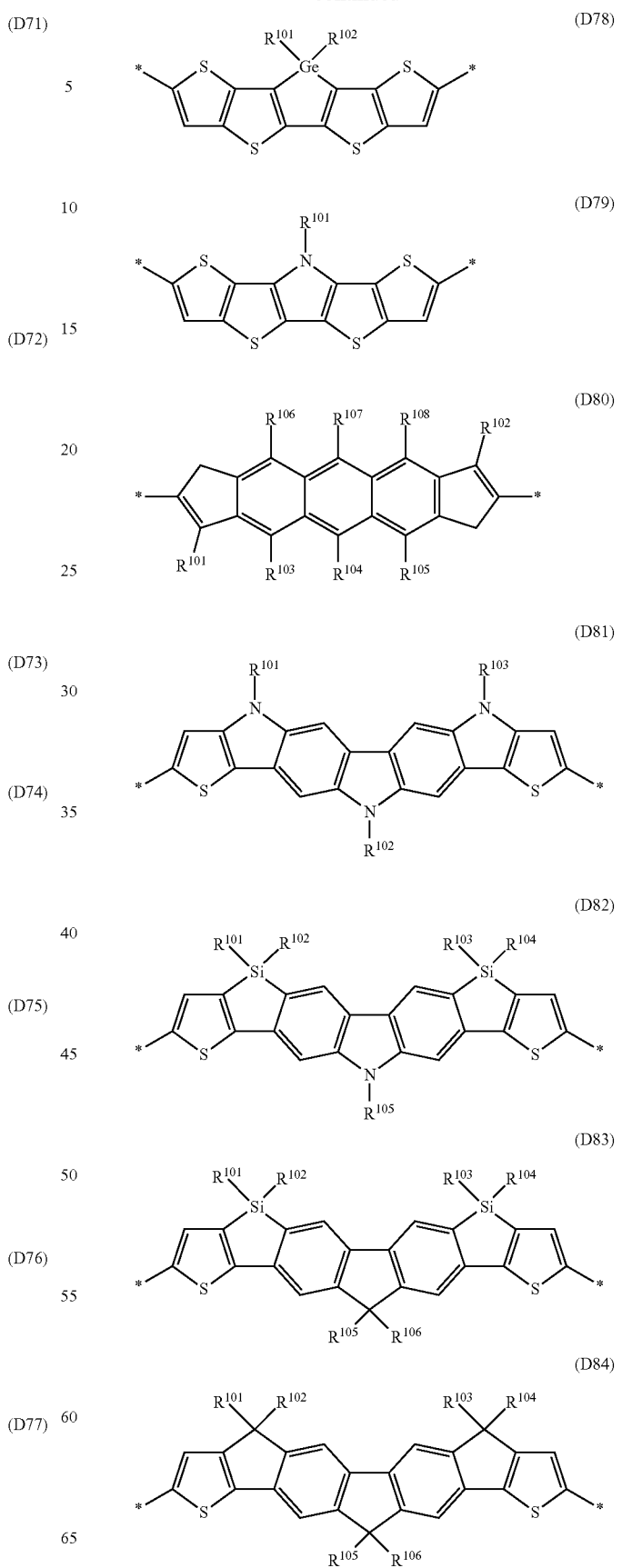

-continued
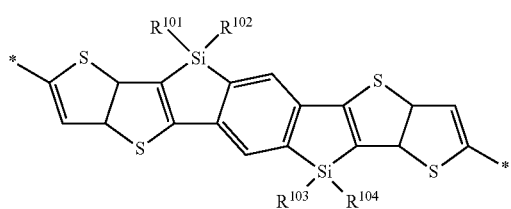
(D85)
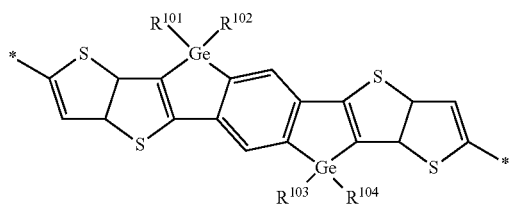
(D86)
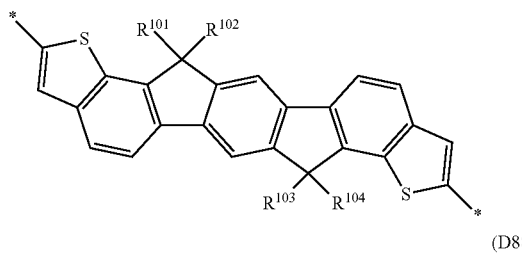
(D87)
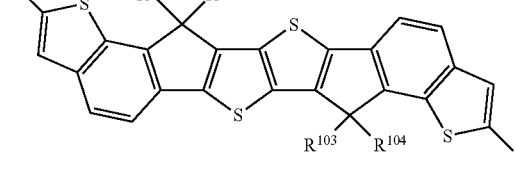
(D88)
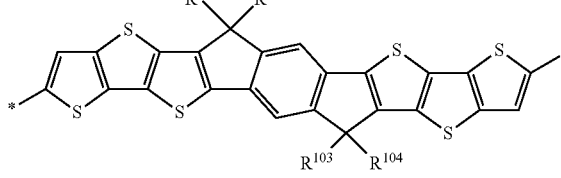
(D89)
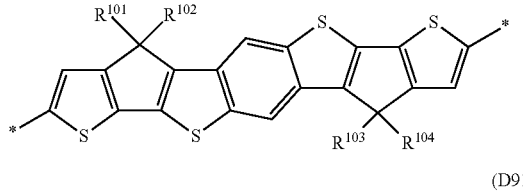
(D90)
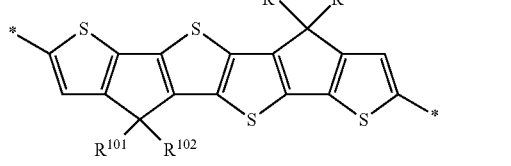
(D91)
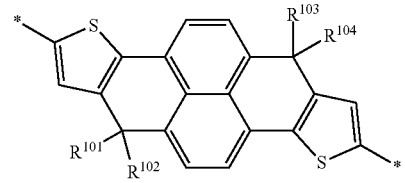
(D92)
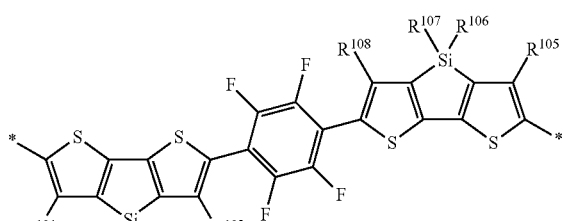
(D93)
(D94)
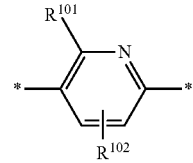
(D95)
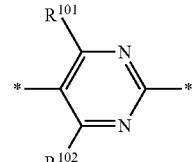
(D96)
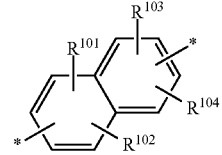
(D97)
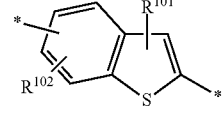
(D98)
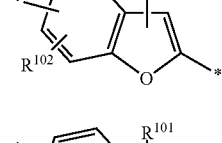
(D99)
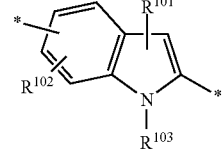
(D100)

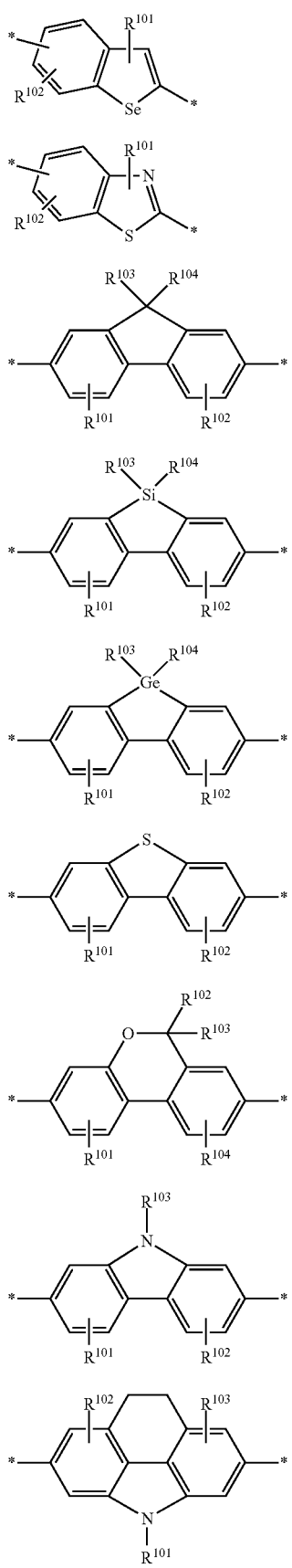
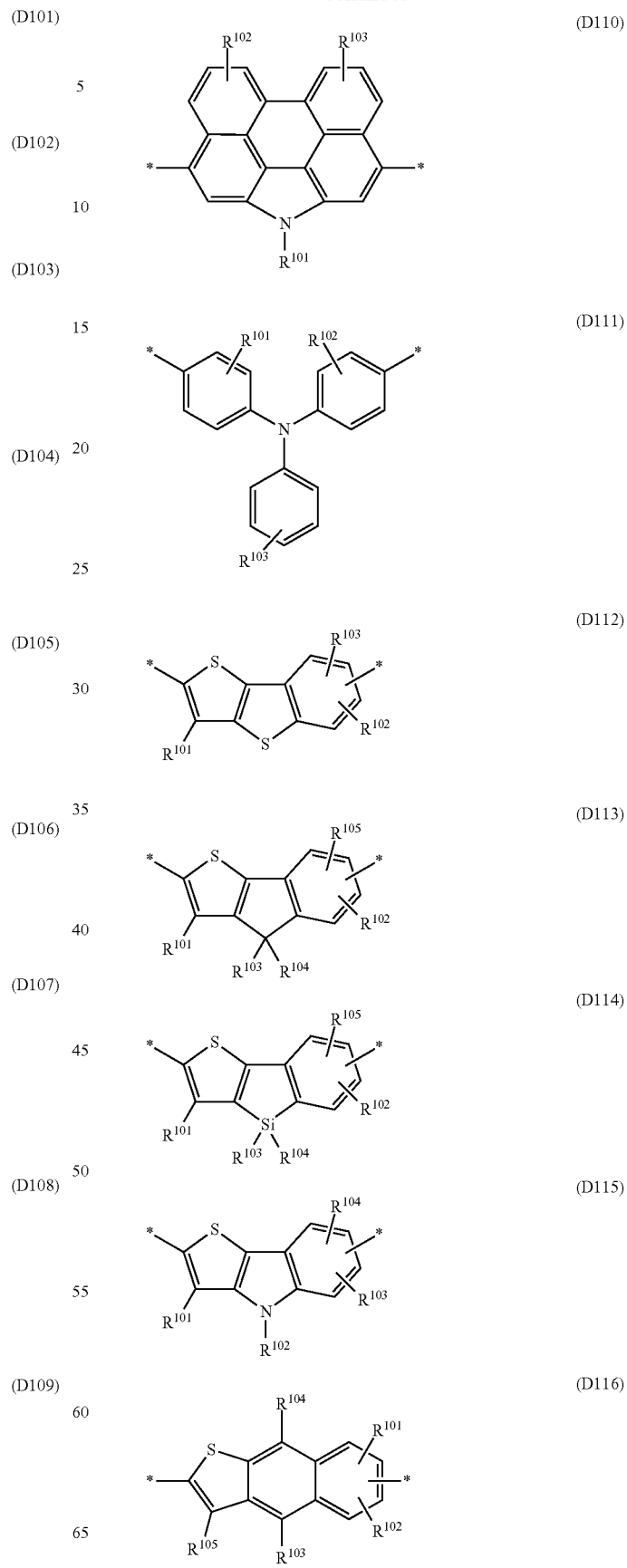

(D117)
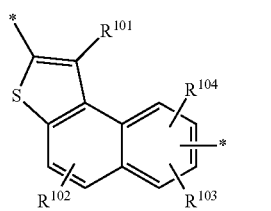
(D118)
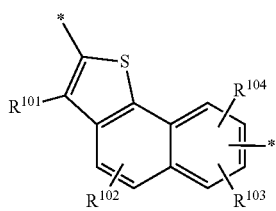
(D119)
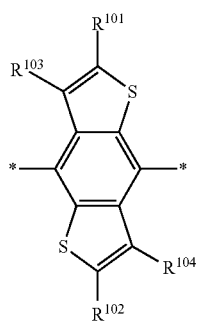
(D120)
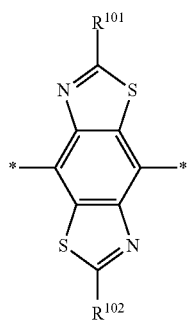
(D121)
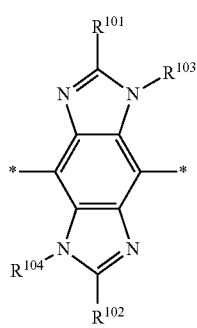
(D122)
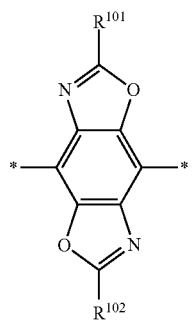
(D123)
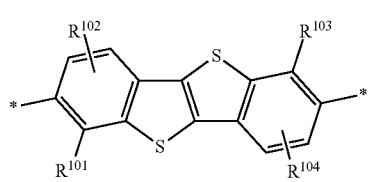
(D124)
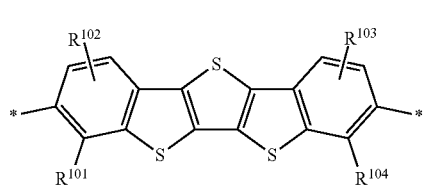
(D125)
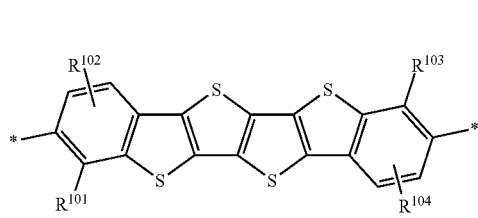
(D126)
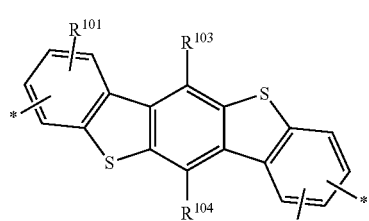
(D127)
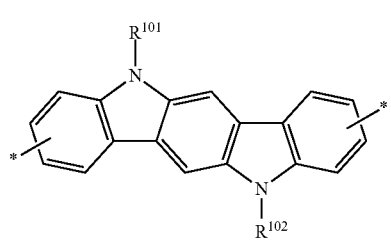
(D128)
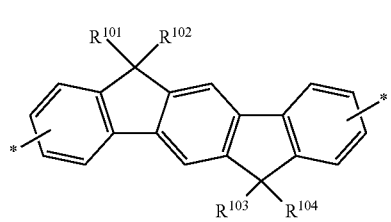

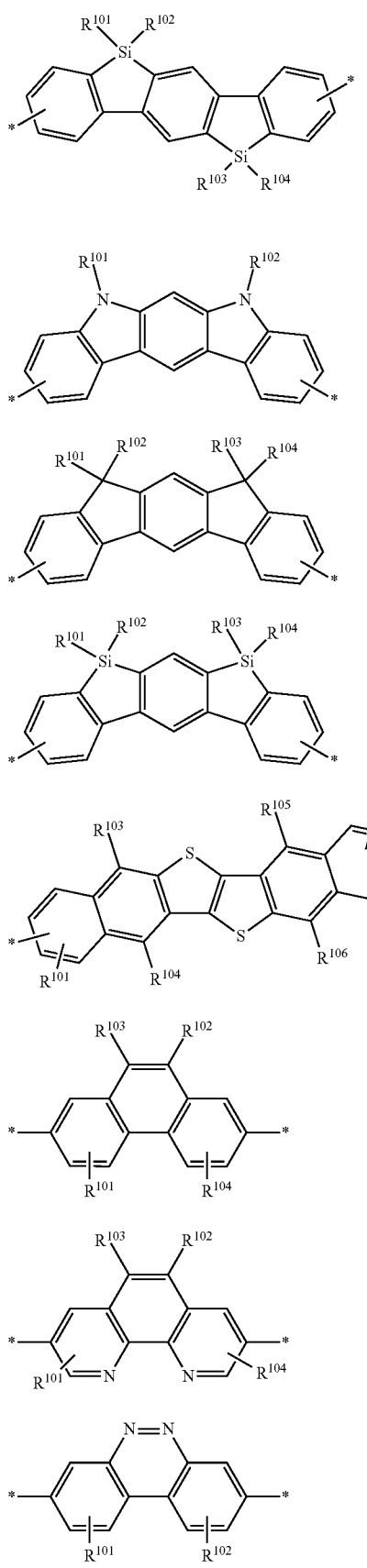
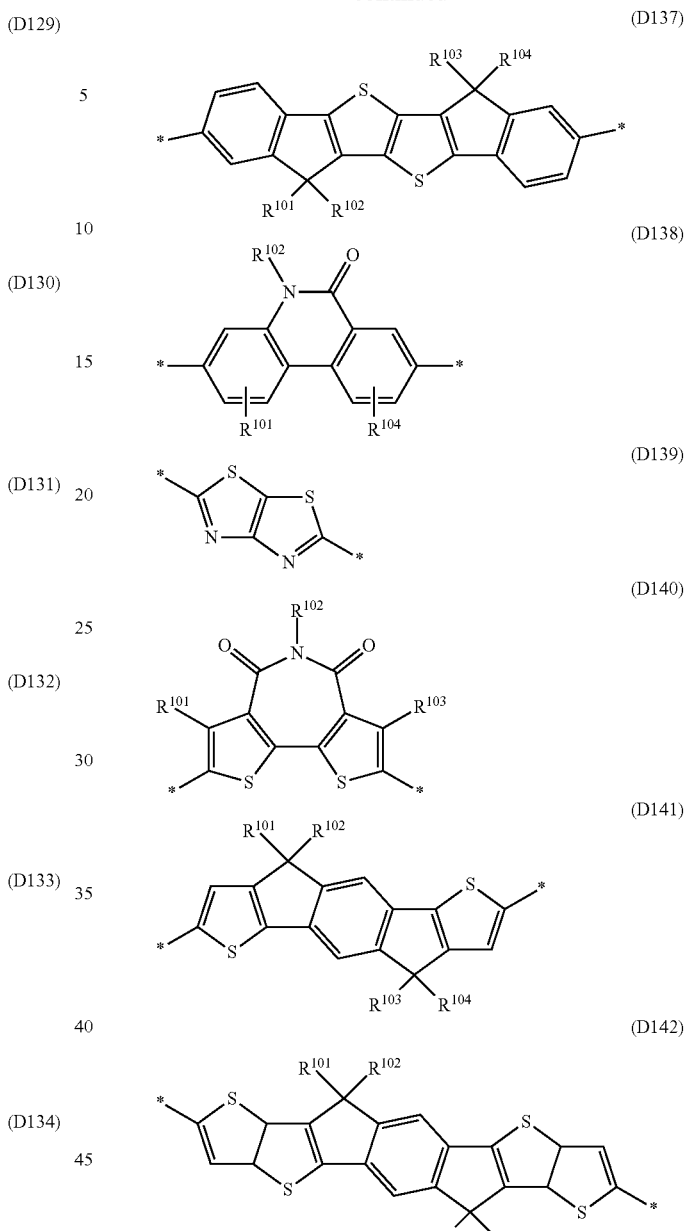

wherein $R^{101}$, $R^{102}$, $R^{103}$, $R^{104}$, $R^{105}$, $R^{106}$, $R^{107}$ and $R^{108}$ are independently of each other selected from the group consisting of H and $R^S$ as defined herein.

$R^S$ is at each occurrence independently a carbyl group as defined herein and preferably selected from the group consisting of any group $R^T$ as defined herein, hydrocarbyl having from 1 to 40 carbon atoms wherein the hydrocarbyl may be further substituted with one or more groups $R^T$, and hydrocarbyl having from 1 to 40 carbon atoms comprising one or more heteroatoms selected from the group consisting of N, O, S, P, Si, Se, As, Te or Ge, with N, O and S being preferred heteroatoms, wherein the hydrocarbyl may be further substituted with one or more groups $R^T$.

Preferred examples of hydrocarbyl suitable as $R^S$ may at each occurrence be independently selected from phenyl, phenyl substituted with one or more groups $R^T$, alkyl and alkyl substituted with one or more groups $R^T$, wherein the alkyl has at least 1, preferably at least 5 and has at most 40, more preferably at most 30 or 25 or 20, even more preferably at most 15 and most preferably at most 12 carbon atoms. It is noted that for example alkyl suitable as $R^S$ also includes fluorinated alkyl, i.e. alkyl wherein one or more hydrogen is replaced by fluorine, and perfluorinated alkyl, i.e. alkyl wherein all of the hydrogen are replaced by fluorine.

$R^T$ is at each occurrence independently selected from the group consisting of F, Br, Cl, —CN, —NC, —NCO, —NCS, —OCN, —SCN, —C(O)NR$^O$R$^{OO}$, —C(O)X$^O$, —C(O)R$^O$, —NH$_2$, —NR$^O$R$^{OO}$, —SH, —SR$^O$, —SO$_3$H, —SO$_2$R, —OH, —OR$^O$, —NO$_2$, —SF$_5$ and —SiR$^O$R$^{OO}$R$^{OOO}$. Preferred $R^T$ are selected from the group consisting of F, Br, Cl, —CN, —NC, —NCO, —NCS, —OCN, —SCN, —C(O)NR$^O$R$^{OO}$, —C(O)X$^O$, —C(O)R$^O$, —NH$_2$, —NR$^O$R$^{OO}$, —SH, —SR$^O$, —OH, —OR$^O$ and —SiR$^O$R$^{OO}$R$^{OOO}$. Most preferred $R^T$ is F.

$R^O$, $R^{OO}$ and $R^{OOO}$ are at each occurrence independently of each other selected from the group consisting of H, F and hydrocarbyl having from 1 to 40 carbon atoms. Said hydrocarbyl preferably has at least 5 carbon atoms. Said hydrocarbyl preferably has at most 30, more preferably at most 25 or 20, even more preferably at most 20, and most preferably at most 12 carbon atoms. Preferably, $R^O$, $R^{OO}$ and $R^{OOO}$ are at each occurrence independently of each other selected from the group consisting of H, F, alkyl, fluorinated alkyl, alkenyl, alkynyl, phenyl and fluorinated phenyl. More preferably, $R^O$, $R^{OO}$ and $R^{OOO}$ are at each occurrence independently of each other selected from the group consisting of H, F, alkyl, fluorinated, preferably perfluorinated, alkyl, phenyl and fluorinated, preferably perfluorinated, phenyl.

It is noted that for example alkyl suitable as $R^O$, $R^{OO}$ and $R^{OOO}$ also includes perfluorinated alkyl, i.e. alkyl wherein all of the hydrogen are replaced by fluorine.

Examples of suitable alkyls may be selected from the group consisting of methyl, ethyl, n-propyl, iso-propyl, n-butyl, iso-butyl, tert-butyl (or "t-butyl"), pentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl (—C$_{20}$H$_{41}$).

$X^O$ is halogen. Preferably $X^O$ is selected from the group consisting of F, Cl and Br.

A hydrocarbyl group comprising a chain of 3 or more carbon atoms and heteroatoms combined may be straight chain, branched and/or cyclic, including spiro and/or fused rings.

Hydrocarbyl suitable as $R^S$, $R^O$, $R^{OO}$ and/or $R^{OOO}$ may be saturated or unsaturated. Examples of saturated hydrocarbyl include alkyl. Examples of unsaturated hydrocarbyl may be selected from the group consisting of alkenyl (including acyclic and cyclic alkenyl), alkynyl, allyl, alkyldienyl, polyenyl, aryl and heteroaryl.

Preferred hydrocarbyl suitable as $R^S$, $R^O$, $R^{OO}$ and/or $R^{OOO}$ include hydrocarbyl comprising one or more heteroatoms and may for example be selected from the group consisting of alkoxy, alkylcarbonyl, alkoxycarbonyl, alkylcarbonyloxy and alkoxycarbonyloxy, alkylaryloxy, arylcarbonyl, aryloxycarbonyl, arylcarbonyloxy and aryloxycarbonyloxy.

Preferred examples of aryl and heteroaryl comprise mono-, bi- or tricyclic aromatic or heteroaromatic groups that may also comprise condensed rings.

Especially preferred aryl and heteroaryl groups may be selected from the group consisting of phenyl, phenyl wherein one or more CH groups are replaced by N, naphthalene, fluorene, thiophene, pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, thieno[3,2-b]thiophene, thieno[2,3-b]thiophene, dithienothiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b;4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole and benzothiadiazole.

Preferred examples of an alkoxy group, i.e. a corresponding alkyl group wherein the terminal CH$_2$ group is replaced by —O—, can be straight-chain or branched, preferably straight-chain (or linear). Suitable examples of such alkoxy group may be selected from the group consisting of methoxy, ethoxy, propoxy, butoxy, pentoxy, hexoxy, heptoxy, octoxy, nonoxy, decoxy, undecoxy, dodecoxy, tridecoxy, tetradecoxy, pentadecoxy, hexadecoxy, heptadecoxy and octadecoxy.

Preferred examples of alkenyl, i.e. a corresponding alkyl wherein two adjacent CH$_2$ groups are replaced by —CH═CH— can be straight-chain or branched. It is preferably straight-chain. Said alkenyl preferably has 2 to 10 carbon atoms. Preferred examples of alkenyl may be selected from the group consisting of vinyl, prop-1-enyl, or prop-2-enyl, but-1-enyl, but-2-enyl or but-3-enyl, pent-1-enyl, pent-2-enyl, pent-3-enyl or pent-4-enyl, hex-1-enyl, hex-2-enyl, hex-3-enyl, hex-4-enyl or hex-5-enyl, hept-1-enyl, hept-2-enyl, hept-3-enyl, hept-4-enyl, hept-5-enyl or hept-6-enyl, oct-1-enyl, oct-2-enyl, oct-3-enyl, oct-4-enyl, oct-5-enyl, oct-6-enyl or oct-7-enyl, non-1-enyl, non-2-enyl, non-3-enyl, non-4-enyl, non-5-enyl, non-6-enyl, non-7-enyl, non-8-enyl, dec-1-enyl, dec-2-enyl, dec-3-enyl, dec-4-enyl, dec-5-enyl, dec-6-enyl, dec-7-enyl, dec-8-enyl and dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples of particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Alkenyl groups having up to 5 C atoms are generally preferred.

Preferred examples of oxaalkyl, i.e. a corresponding alkyl wherein one non-terminal CH$_2$ group is replaced by —O—, can be straight-chain or branched, preferably straight chain. Specific examples of oxaalkyl may be selected from the group consisting of 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl and 2-, 3-, 4-, 5-, 6-, 7-, 8- or 9-oxadecyl.

Preferred examples of carbonyloxy and oxycarbonyl, i.e. a corresponding alkyl wherein one CH$_2$ group is replaced by —O— and one of the thereto adjacent CH$_2$ groups is replaced by —C(O)—. may be selected from the group consisting of acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxy-carbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, and 4-(methoxycarbonyl)-butyl.

Preferred examples of thioalkyl, i.e where one $CH_2$ group is replaced by —S—, may be straight-chain or branched, preferably straight-chain. Suitable examples may be selected from the group consisting of thiomethyl (—$SCH_3$), 1-thioethyl (—$SCH_2CH_3$), 1-thiopropyl (—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) and 1-(thiododecyl).

A fluoroalkyl group is preferably perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or partially fluorinated alkyl, in particular 1,1-difluoroalkyl, all of which are straight-chain or branched.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, 2-butyloctyl, 2-hexyldecyl, 2-octyldodecyl, 7-decylnonadecyl, in particular 2-methylbutyl, 2-methylbutoxy, 2-methylpentoxy, 3-methylpentoxy, 2-ethyl-hexoxy, 1-methylhexoxy, 2-octyloxy, 2-oxa-3-methylbutyl, 3-oxa-4-methylpentyl, 4-methylhexyl, 2-butyloctyl, 2-hexyldecyl, 2-octyldodecyl, 7-decylnonadecyl, 3,8-dimethyloctyl, 2-hexyl, 2-octyl, 2-nonyl, 2-decyl, 2-dodecyl, 6-meth-oxyoctoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloropropionyloxy, 2-chloro-3-methylbutyryloxy, 2-chloro-4-methylvaleryl-oxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Most preferred is 2-ethylhexyl.

Preferred achiral branched groups are isopropyl, isobutyl (=methylpropyl), isopentyl (=3-methylbutyl), tert. butyl, isopropoxy, 2-methyl-propoxy and 3-methylbutoxy.

In a preferred embodiment, the organyl groups are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

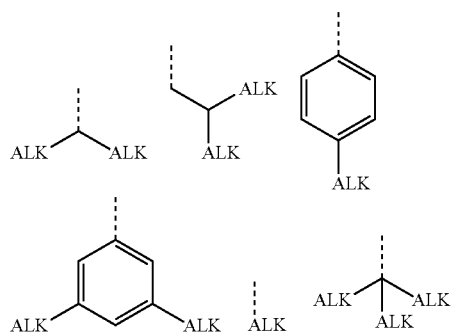

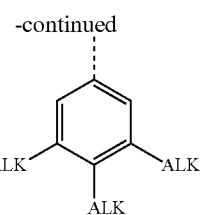

wherein "ALK" denotes optionally fluorinated, preferably linear, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

Further, in some preferred embodiments in accordance with the present invention, the organic semiconducting materials are polymers or copolymers that encompass one or more repeating units, e.g. M in formula (I), selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

Preferred examples of organic semiconducting materials comprise one or more monomeric units selected from the group consisting of formulae (A1) to (A83) and one or more monomeric units selected from the group consisting of formulae (D1) to (D142).

Further preferred examples of organic semiconductor materials that can be used in this invention include compounds, oligomers and derivatives of compounds selected from the group consisting of conjugated hydrocarbon polymers such as polyacene, polyphenylene, poly(phenylene vinylene), polyfluorene including oligomers of those conjugated hydrocarbon polymers; condensed aromatic hydrocarbons, such as, tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(di-thieno[3,2-b2',3'-d]thiophene); 2,8-dialkyl, substituted dialkyl, diaryl or substituted diaryl anthradithiophene; 2,2'-bisbenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

Also preferred organic semiconducting materials may be selected from the group of small molecules or monomers or polymers comprising a 2,7-(9,9')spirobifluorene moiety, optionally substituted and preferably substituted with amino groups. Such spirobifluorenes are, for example, disclosed in WO 97/39045. Examples of spirobifluorenes suitable for use as monomeric unit M of formula (I) may be selected from the group consisting of formulae (V-1) to (V-7)

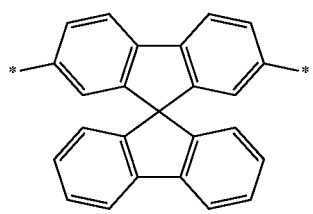
(V-1)

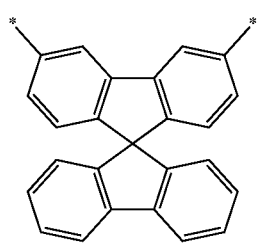
(V-2)

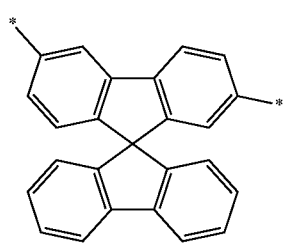
(V-3)

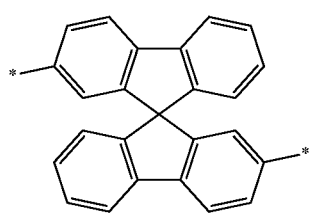
(V-4)

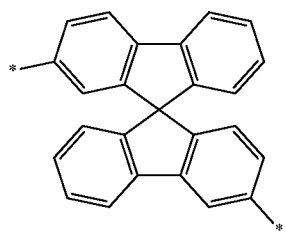
(V-5)

-continued

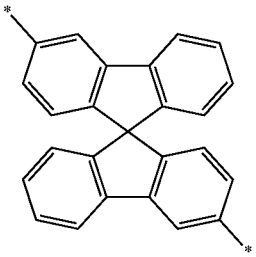
(V-6)

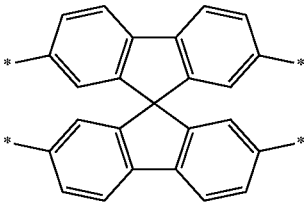
(V-7)

wherein each of the hydrogen atoms may independently of any other be as defined herein in respect to $R^{101}$ and each asterisk "*" independently may denote a bond to neighboring moiety (for example in a polymer) or may denote a bond to a group as defined above for $R^{101}$ (for example in a compound of formula (I-a) or (I-b)). In respect to formulae (V-1) to (V-7) preferred substituents, including the ones for "*", may be selected from the group consisting of alkyl having from 1 to 20 carbon atoms; aryl having from 6 to 20 carbon atoms, said aryl being optionally substituted with alkyl or alkoxy having from 1 to 20, preferably 1 to 10 carbon atoms; and $NR^{110}R^{111}$ with $R^{110}$ and $R^{111}$ being independently of each other selected from the group consisting of alkyl having from 1 to 20 carbon atoms, aryl having from 6 to 20 carbon atoms, said aryl being optionally substituted with alkyl or alkoxy having from 1 to 20, preferably 1 to 10 carbon atoms, most preferably $R^{110}$ and $R^{111}$ being independently of each other selected from methyl, ethyl, n-propyl, iso-propyl, n-butyl, iso-butyl, tert-butyl, pentyl, methoxy, ethoxy, n-propoxy, iso-propoxy n-butoxy, iso-butoxy, tert-butoxy and pentoxy.

The present organic semiconducting polymers may preferably be produced by aryl-aryl coupling and polymerisation methods, which may, for example, be one or more of Yamamoto coupling, Kumada coupling, Negishi coupling, Suzuki coupling, Stille coupling, Sonogashira coupling, Heck coupling, C—H activation coupling, Ullmann coupling and Buchwald coupling. Especially preferred are Suzuki coupling, Negishi coupling, Stille coupling and Yamamoto coupling. Suzuki coupling is described for example in WO 00/53656 A1. Negishi coupling is described for example in J. Chem. Soc., Chem. Commun., 1977, 683-684. Yamamoto coupling is described for example in T. Yamamoto et al., Prog. Polym. Sci., 1993, 17, 1153-1205, or WO 2004/022626 A1, and Stille coupling is described for example in Z. Bao et al., J. Am. Chem. Soc., 1995, 117, 12426-12435. For example, when using Yamamoto coupling, monomers having two reactive halide groups are preferably used. When using Suzuki coupling, compounds of formula (I-b) having two reactive boronic acid or boronic acid ester groups or two reactive halide groups are preferably used. When using Stille coupling, monomers having two reactive stannane groups or two reactive halide groups are preferably used. When using Negishi coupling, monomers having two reactive organozinc groups or two reactive halide groups are preferably used.

Preferred catalysts, especially for Suzuki, Negishi or Stille coupling, are selected from Pd(0) complexes or Pd(II) salts. Preferred Pd(0) complexes are those bearing at least one phosphine ligand, for example Pd(Ph$_3$P)$_4$. Another preferred phosphine ligand is tris(ortho-tolyl)phosphine, for example Pd(o-Tol$_3$P)$_4$. Preferred Pd(II) salts include palladium acetate, for example Pd(OAc)$_2$. Alternatively the Pd(0) complex can be prepared by mixing a Pd(0) dibenzylideneacetone complex, for example tris(dibenzyl-ideneacetone) dipalladium(0), bis(dibenzylideneacetone)-palladium(0), or Pd(II) salts e.g. palladium acetate, with a phosphine ligand, for example triphenylphosphine, tris(ortho-tolyl)phosphine or tri(tert-butyl)phosphine. Suzuki polymerisation is performed in the presence of a base, for example sodium carbonate, potassium carbonate, lithium hydroxide, potassium phosphate or an organic base such as tetraethylammonium carbonate or tetraethylammonium hydroxide. Yamamoto polymerisation employs a Ni(0) complex, for example bis(1,5-cyclooctadienyl)nickel(0).

Suzuki and Stille polymerisation may be used to prepare homopolymers as well as statistical, alternating and block random copolymers. Statistical or block copolymers can be prepared for example from the above monomers of formula (I-b), wherein one of the reactive groups is halogen and the other reactive group is a boronic acid, boronic acid derivative group or and alkylstannane. The synthesis of statistical, alternating and block copolymers is described in detail for example in WO 03/048225 A2 or WO 2005/014688 A2.

As alternatives to halogens as described above, leaving groups of formula —O—SO$_2$Z$^1$ can be used wherein Z$^1$ is as described above. Particular examples of such leaving groups are tosylate, mesylate and triflate.

Preferably the present polymers have a molecular weight M$_n$ of at least 5,000 g/mol, more preferably of at least 10,000 g/mol. Preferably the present polymers have a molecular weight M$_n$ of at most 1,000,000 g/mol, more preferably of at most 750,000 g/mol or 500,000 g/mol or 250,000 g/mol, more preferably of at most 200,000 g/mol, even more preferably of at most 150,000 g/mol and most preferably of at most 100,000 g/mol.

As used herein, unless stated otherwise the molecular weight is given as the number average molecular weight M$_n$ or weight average molecular weight M$_w$, which is determined by gel permeation chromatography (GPC) against polystyrene standards in eluent solvents such as tetrahydrofuran, trichloromethane (TCM, chloroform), chlorobenzene or 1,2,4-trichlorobenzene. The molecular weight distribution ("MWD"), which may also be referred to as polydispersity index ("PDI"), of a polymer is defined as the ratio M$_w$/M$_n$. The degree of polymerization, also referred to as total number of repeat units, m, will be understood to mean the number average degree of polymerization given as m=M$_n$/M$_U$, wherein M$_n$ is the number average molecular weight of the polymer and M$_U$ is the molecular weight of the single repeat unit; see J. M. G. Cowie, *Polymers: Chemistry & Physics of Modern Materials*, Blackie, Glasgow, 1991.

For the purposes of the present application, molecular weights of the organic semiconducting materials may be determined by gel permeation chromatography (GPC) on commercially available equipment, having two Phenomenex Phenogel Linear Column and a Phenogel 10$^6$ Å Column (all columns are 10 m packed capillary columns) and a refractive index detector, in chlorobenzene at 50° C. using commercially available narrow molecular weight standards of polystyrene for calibration.

Crystallization Agent

The crystallization agent has a melting temperature equal to or higher than the substrate temperature. The crystallization agent also has a boiling temperature or sublimation temperature that is equal to or higher than the boiling temperature of the solvent.

Preferably the crystallization agent has a melting temperature of at least 10° C. (for example 20° C., 30° C., 40° C., 50° C., 60° C., 70° C., 80° C., 90° C., 100° C. or even more) higher than the substrate temperature.

Preferably the crystallization agent has a boiling temperature of at least 10° C. (for example 20° C., 30° C., 40° C., 50° C., 60° C., 70° C., 80° C., 90° C., 100° C. or even more) higher than the boiling temperature of the solvent.

Preferably the crystallization agent has a boiling temperature or sublimation temperature of at most 400° C.

Exemplary crystallization agents may be selected from the group consisting of aromatic hydrocarbons (for example, benzene), wherein one or more, preferably two or more, and most preferably three or more hydrogen atom is/are replaced with halogen, said halogen being selected from the group consisting of fluorine, chlorine, bromine and iodine, more preferably said halogen being fluorine or chlorine, and most preferably said halogen being chlorine. A preferred example of such a crystallization agent is 1,3,5-trichlorobenzene (also denoted as "TCB").

Solvent

Preferably, the solvent has a boiling temperature (under standard conditions) of at most 300° C., more preferably of at most 250° C. and most preferably of at most 200° C.

Preferably, the solvent has a boiling temperature (under standard conditions) of at least the ink temperature, i.e. equal to or higher than the ink temperature. It may generally be preferred that the boiling temperature of the solvent is higher than the ink temperature. For example, the boiling temperature of the solvent may be 5° C., 10°, 15° C., 20° C., 30° C., 40° C., 50° C. or even more above the ink temperature.

Solvents may, for example, be selected from the group consisting of aliphatic hydrocarbons, chlorinated hydrocarbons, aromatic hydrocarbons, ketones, ethers and mixtures thereof. Preferred solvents may be selected from aromatic hydrocarbons (for example, benzene), wherein one hydrogen atom is replaced with a halogen, said halogen being selected from the group consisting of fluorine, chlorine, bromine and iodine, more preferably said halogen being fluorine or chlorine, and most preferably said halogen being chlorine.

Exemplary solvents which can be used include 1,2,4-trimethylbenzene, 1,2,3,4-tetra-methyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, N,N-dimethylformamide, 2-chloro-6-fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylanisole, 3-methylanisole, 4-fluoro-3-methylanisole, 2-fluorobenzonitrile, 4-fluoroveratrol, 2,6-dimethylanisole, 3-fluorobenzo-nitrile, 2,5-dimethylanisole, 2,4-dimethylanisole, benzonitrile, 3,5-dimethyl-anisole, N,N-dimethylaniline, ethyl benzoate, 1-fluoro-3,5-dimethoxy-benzene, 3-phenoxytoluene, 1-methyl-naphthalene, N-methylpyrrolidinone, 3-fluorobenzo-trifluoride, benzotrifluoride, dioxane, trifluoromethoxy-benzene, 4-fluorobenzotrifluoride, 3-fluoropyridine, toluene, 2-fluoro-toluene, 2-fluorobenzotrifluoride, 3-fluorotoluene, 4-isopropylbiphenyl, phenyl ether, pyridine, 4-fluorotoluene, 2,5-difluorotoluene, 1-chloro-2,4-difluorobenzene, 2-fluoropyridine, 3-chlorofluoro-benzene, 1-chloro-2,5-difluorobenzene, 4-chlorofluorobenzene, chloro-benzene, o-dichlorobenzene, 2-chlorofluorobenzene, p-xylene, m-xylene, o-xylene or mixture of o-, m-, and p-isomers. Solvents with relatively low polarity are generally preferred.

Examples of especially preferred solvents include, without limitation, dichloromethane, trichloromethane (also known as "chloroform"), chlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, N,N-dimethylformamide, dimethylacetamide, dimethylsulfoxide, tetraline, decaline, indane, methyl benzoate, ethyl benzoate, mesitylene and/or mixtures thereof. Of these, chlorobenzene is a particularly suitable solvent.

Electronic or Optoelectronic Devices and their Production

The present process for the production of electronic or optoelectronic devices further comprises the step of
(c) applying the ink composition to the substrate by a liquid deposition method to obtain a coated substrate.

For thin layers in electronic or optoelectronic devices the present ink composition may be applied to the substrate by any suitable liquid deposition method. Preferred liquid deposition methods include, without limitation, dip coating, spin coating, ink-jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing. Ink jet printing is particularly preferred when high resolution layers and devices need to be prepared.

Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the ink formulation to a substrate. Additionally semi-industrial heads such as those manufactured by Brother, Epson, Konica, Seiko Instruments Toshiba TEC or single nozzle microdispensers such as those produced by Microdrop and Microfab may be used.

For use in ink-jet printing the present ink formulation preferably has a viscosity at 20° C. of 1 mPa·s to 100 mPa·s, more preferably of 1 mPa·s to 50 mPa·s and most preferably of 1 mPa·s to 30 mPa·s.

For the liquid deposition method It is generally desired that the temperature of the ink composition is higher than the temperature of the substrate. Preferably, the temperature of the ink composition is at least 10° C. or 20° C. or 30° C. higher than the temperature of the substrate.

Figure 2:
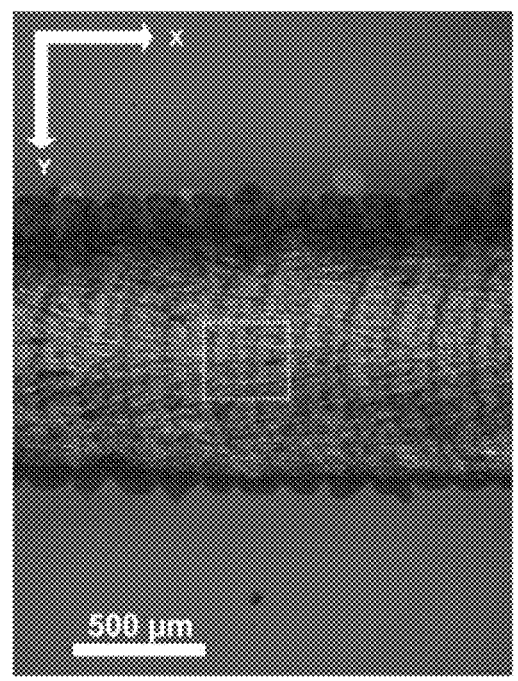
FIG. 2 shows a polarized light micrographic image of a fiber produced by an ink-jet printing process in accordance with the present application, with x indicating the printing direction and y indicating the printing head direction.

A schematic and exemplary representation of the printing process used herein is shown in FIG. 1, wherein the printing head direction, i.e. the direction in which the printing head moves, is perpendicular to the printing direction. While alternatives may also be possible, for the present process it is generally preferred that the printing head direction is perpendicular to the printing direction. For the present application the substrate may be kept stationary and the printing head is then moved not only in the printing head direction (direction marked "y" in FIG. 1) but also in the printing direction (direction marked "x" in FIG. 1). Alternatively, the substrate may be moved in a direction counter to the printing direction and the printing head is then moved in the printing head direction only. At each position the printing head ejects small droplets of ink composition through its nozzles, said droplets then being deposited on (or applied to) the substrate. The deposited ink composition then starts to dry, i.e. the solvent comprised in the ink composition starts to evaporate. This will lead to the formation of a drying band in the printing head direction, said drying band subsequently advancing in the printing direction. Without wishing to be bound by theory this seems to result in effectively pushing the crystallization agent out of solution and forcing the residual organic semiconductor material in the solution to grow epitaxially on the crystals formed by the crystallization agent. The resulting fiber, following an additional step of removing the crystallization agent, such step being optional, is shown in FIG. 2. Such fibers may have a length of several centimeters and may be arranged in bundles, optionally with gaps between such fiber bundles.

Because the process of the present application allows for the deposition of such highly oriented fibers in any geometry, the present process is believed to simplify the production of electronic and optoelectronic devices, which need to comprise fibers having a high degree of order and orientation. Consequently, the fibers produced by the present process show highly anisotropic behavior, for example, with regards to charge carrier mobilities Preferably, the process for the production of electronic or optoelectronic devices subsequently further comprises the step of
(d) drying the coated substrate obtained in step (c).

Figure 3:
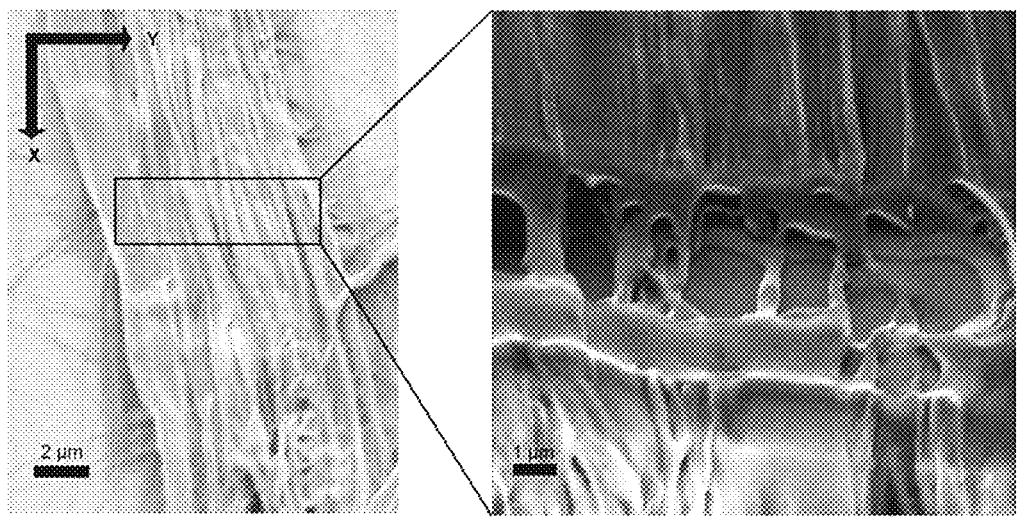
FIG. 3 shows a scanning electron microscope (SEM) image of a fiber bundle (on the left) and a cross-section of such fiber bundle (on the right), the fibers produced by an ink-jet printing process in accordance with the present application.
Figure 4:
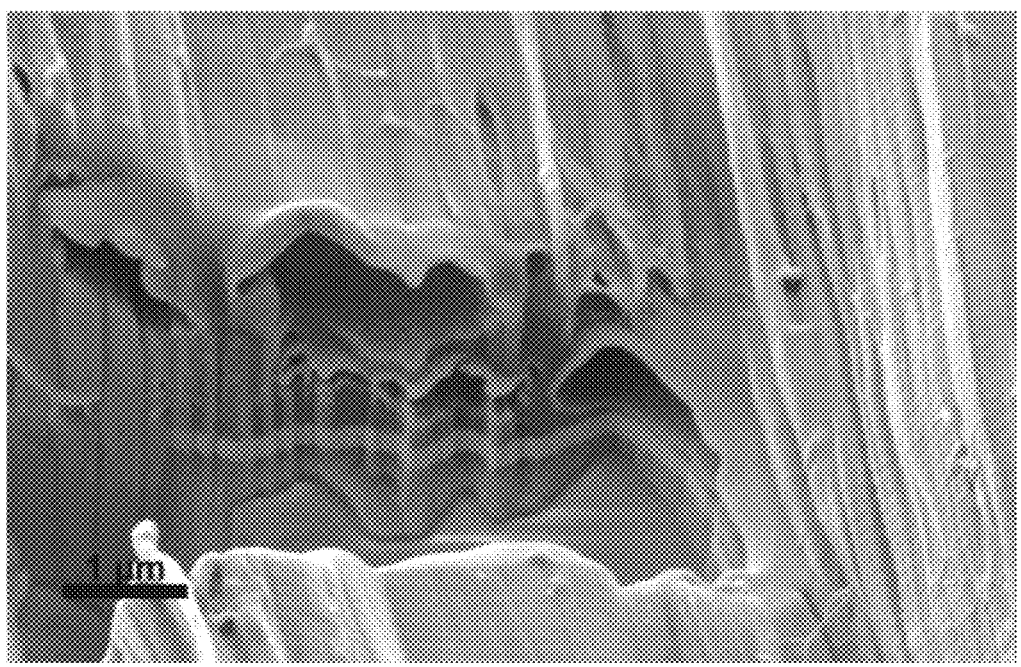
FIG. 4 shows a cross-section of a fiber produced by an ink-jet printing process in accordance with the present application.

Very surprisingly it has been found that the fibers produced in accordance with the present application, preferably including a drying step (d), are in fact hollow. This can be seen, for example, from the cross-sections of either a fiber bundle as shown in FIG. 3 or FIG. 4 of fiber bundles produced using an ink-jet printing process in accordance with the present application.

Thus, the present application also provides for fibers comprising a hollow core and a shell comprising, preferably consisting of, one or more, preferably one, organic semiconductor material.

Though not generally limited, the outer diameter of such fibers comprising a hollow core and a shell comprising an organic semiconductor material is preferably at least 1 μm and at most 2000 μm.

Drying step (d) may, for example, be performed under vacuum and/or elevated temperature. Preferably the drying step is performed at a temperature of at least 15° C., more preferably of at least 20° C. or 25° C., even more preferably of at least 30° C. or 40° C. and most preferably of at least 50° C. The upper limit for the temperature of the drying step is limited, for example, by the thermal stability of the organic semiconductor material and/or the crystallization agent, and may preferably be at most 300° C., more preferably at most 250° C. or 200° C., even more preferably at most 180° C. or 160° C. or 140° C. or 120° C. or 100° C., and most preferably at most 90° C. or 80° C.

Electronic or optoelectronic devices that may be produced according to the present method may be selected from, but are not limited to, the group consisting of organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), organic solar cells (O-SC), photodiodes, laser diodes, photoconductors, organic photodetectors (OPD), electrophotographic devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

The present process allows for the production of novel electronic and optoelectronic devices, such devices comprising fibers, preferably fibers, comprising an organic semiconducting material. The present devices are characterized by the advantage that their properties may be anisotropic, thus allowing the devices to be more efficiently being adapted to specific applications and needs.

EXAMPLES

The following examples are intended to illustrate the workings and the advantages of the present application in a non-limiting way.

Glass (BOROFLOAT 33 borosilicate glass, Schott AG, Germany) and silicon wafers (CZ-Si, polished, Microchemicals GmbH, Germany) were used as substrates. Prior to use the substrates were successively cleaned with acetone and isopropanol in an ultrasonic bath, followed by an oxygen plasma treatment (Tetra 30, Diener Electronics GmbH+Co. KG, Germany) for 5 min.

Chlorobenzene (CB), 1,3,5-trichlorobenzene (TCB), poly (vinylidene fluoride-co-hexafluoro-propylene) (PVDF-HFP, $M_w$=400 kg mol$^{-1}$), poly(3-hexylthiophene-2,5-diyl) (P3HT) and anhydrous acetone were obtained from commercial sources, such as for example, from Sigma-Aldrich. 1-Ethyl-3-methylimidazolium tris(pentafluoroethyl)trifluoro-phosphate ([EMIM][FAP]) was obtained from Merck KGaA, Germany.

Example 1—Preparation of the Printing Ink

Chlorobenzene and 1,3,5-trichlorobenzene were mixed in a ratio of CB:TCB=1:0.22; 1:0.11; 1:0.07; and 1:0 and the respective amount of P3HT necessary to obtain a P3HT concentration of 20 g l$^{-1}$ added in a nitrogen-filled glovebox. The mixture was then stirred overnight at a temperature of 80° C.

Example 2—Preparation of Printed Oriented Layers of P3HT

Printed oriented layers of P3HT were prepared by ink-jet printing of the printing ink prepared in Example 1 using a Dimatix DMP-2800 ink-jet printer (Fujifilm) with a Dimatix DMC-11610 series printing head (Fujifilm) having 16 nozzles and a nominal drop volume of 10$^{-12}$ 1 onto a substrate (glass, ITO-coated glass and polished silicon wafer), at a maximum jetting frequency of 5 kHz with a printing head temperature of 47° C. and a custom-built waveform. The substrate temperature was kept at 25° C. The printed layers were then dried at room temperature in a vacuum oven at 15 mbar for 10 min.

A polarized light micrographic image of a so-obtained fiber on a glass substrate is shown in FIG. 2, with x indicating the printing direction and y indicating the printing head direction. Scanning electron microscopy (SEM) images of the corresponding fiber bundle as well as a cross-section thereof is shown in FIG. 3. An enlarged image of such cross-section is shown in FIG. 4. The cross-section clearly shows the hollow core inside the fibers.

Figure 5:
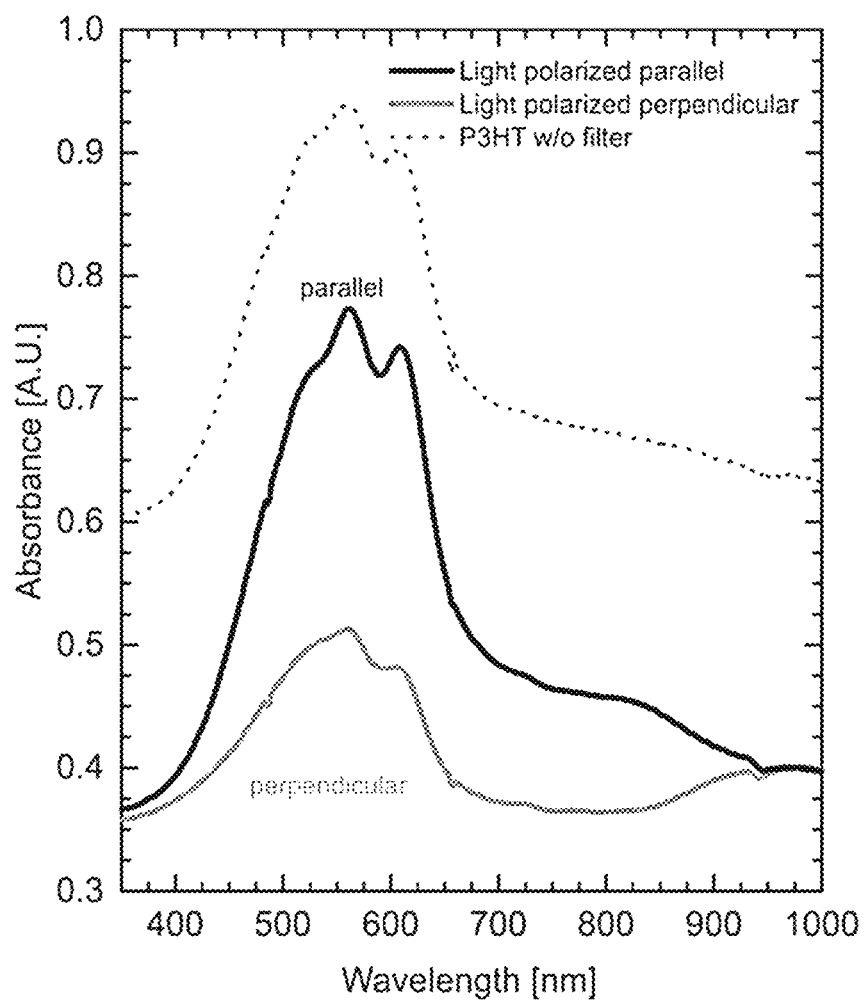
FIG. 5 shows the absorbance spectra of aligned P3HT-fibers, produced by an ink-jet printing process in accordance with the present process, without light source and with light source polarized parallel and perpendicular to the length of the fibers, i.e. the printing direction.
Figure 6:
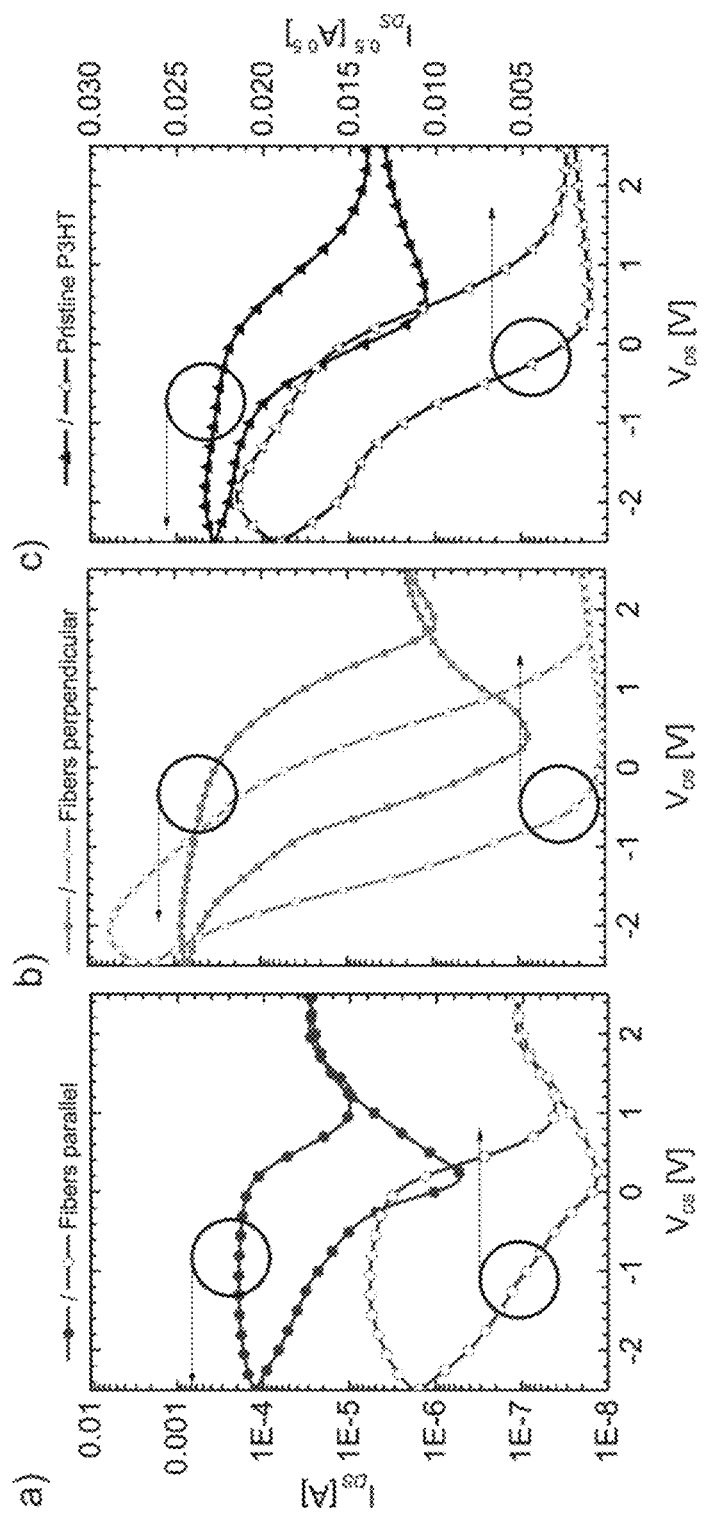
FIGS. 6a and 6b shows the transfer curves of EGOFETs with fibers produced by an ink-jet printing process in accordance with the present application and in FIG. 6c of an EGOFET with a semiconductor material casted from a solvent.

The high degree of order of the present fibers could be shown by polarization dependent absorption measurements. FIG. 5 shows the absorbance spectra of aligned P3HT-fibers, produced by ink-jet printing in accordance with the present process, without light source and with light source polarized parallel and perpendicular to the length of the fibers, i.e. in the printing direction. The anisotropic optical behavior can be attributed to P3HT being uniaxially aligned in the fibers. The absorbance spectra show two major peaks at 555 nm and 610 nm, respectively, the ratio of which is known to be a qualitative sign of the degree of π-π stacking in P3HT.

It could further be shown that, when illuminated with a polarized light source and a corresponding crossed polarizer in from of the camera, fibers produced by ink-jet printing in accordance with the present process showed a significant change in color when the substrate with the fibers was rotated by 45°. By contrast, a sample produced by applying an ink composition without crystallization agent to a substrate did not show such a color change.

Example 3—Electrolyte-Gated Organic Field Effect Transistor (EGOFET)

A bottom-contact transistor was prepared by first patterning source and drain electrodes (2 nm Cr, 30 nm Au) with a channel length of 2000 μm and a channel width of 20 μm onto glass substrates by photolithography and subsequent lift-off. Then the printing inks prepared in Example 1 were applied thereon by an ink-jet printing process parallel and perpendicular to the source and drain electrodes by alignment of the substrate corresponding to the respective printing direction, thereby preparing perpendicular and parallel fibers. An ion-gel solution of poly(vinylidene fluoride-co-hexafluoropropylene), 1-ethyl-3-methylimidazolium tris (pentafluoroethyl)trifluorophosphate and anhydrous acetone in a mass ratio of 1:4:14 was spin coated at 2000 rpm for 30 s and then annealed at 90° C. for 12 hours in a nitrogen-filled glovebox.

Current-voltage characteristics of the resulting EGOFET were recorded with an Agilent 4156C semiconductor Parameter Analyzer or a Keithley 2612A source meter.

Mobilities in the saturated regime were determined as indicated in the following Table 1. It is noted that all of the so-produced devices showed hysteresis, which is believed to be attributable to low ionic mobility in the electrolyte.

TABLE 1

| Sample | Mobility $\mu_{sat}$ [cm$^2$ V$^{-1}$ s$^{-1}$] |
| --- | --- |
| Perpendicular fibers | 1.0 |
| Fibers produced without crystallization agent | 0.4 |
| Parallel fibers | 0.05 |

Generally stated, the method of the present application allows for the deposition of highly ordered fibers by an industrially and commercially suitable liquid deposition method, particularly by an ink-jet printing process. These highly ordered fibers show anisotropic behavior in respect to various properties, such as charge carrier mobilities or light transmittance, which could be shown to be applicable to electronic and optoelectronic devices. It is believed that the present method as well as the fibers obtained by such method will help in allowing to more easily adapt the properties of electronic and optoelectronic devices to their intended applications.

The invention claimed is:

1. A process for the production of electronic or optoelectronic devices comprising
a plurality of fibers comprising hollow core and shell, wherein the plurality of fibers form by
(a) providing a substrate at a substrate temperature;
(b) providing an ink composition at an ink temperature, said ink composition comprising one or more organic semiconductor material, one or more crystallization agent and one or more solvent;
(c) applying the ink composition to the substrate by ink-jet printing to obtain a coated substrate, and
(d) drying, under vacuum or elevated temperature, the coated substrate obtained in step (c);
wherein the plurality of fibers comprise a hollow core and a shell comprising one or more organic semiconductor material,
wherein the crystallization agent has a melting temperature equal to or higher than the substrate temperature and a boiling temperature or sublimation temperature equal to or higher than the boiling temperature of the solvent;
wherein the organic semiconducting material is represented by the following formula (I)

  (I)

wherein
M is selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl;
m is from 1 to 100,000; and
the asterisk * denotes a linkage to an adjacent unit or group;
wherein the crystallization agent is benzene wherein one or more hydrogen atom is/are replaced with halogen, said halogen being selected from the group consisting of fluorine, chlorine, bromine and iodine;
wherein the solvent is selected from the group consisting of dichloromethane, trichloromethane, chlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n butyl acetate, N,N-dimethylformamide, dimethylacetamide, dimethylsulfoxide, tetraline, decaline, indane, methyl benzoate, ethyl benzoate, mesitylene and mixtures thereof; and
wherein the electronic or optoelectronic device is selected from the group consisting of organic field effect transistors (OFET), thin film transistors (TFT), integrated circuits (IC), logic circuits, capacitors, radio frequency identification (RFID) tags, organic light emitting diodes (OLED), organic light emitting transistors (OLET), flat panel displays, backlights of displays, organic photovoltaic devices (OPV), organic solar cells (O-SC), photodiodes, laser diodes, photoconductors, organic photodetectors (OPD), electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

2. The process according to claim 1, wherein the crystallization agent has a melting temperature that is at least 10° C. higher than the substrate temperature.

3. The process according to claim 1, wherein the crystallization agent has a boiling temperature or sublimation temperature that is at least 10° C. higher than the boiling temperature of the solvent.

4. The process according to claim 1, wherein the crystallization agent has a boiling temperature or sublimation temperature of at most 400° C.

5. The process according to claim 1, wherein the solvent has a boiling temperature equal to or higher than the ink temperature.

6. The process according to claim 1, wherein the solvent has a boiling temperature of at most 300° C.

7. The process according to claim 1, wherein the crystallization agent is benzene, wherein two or more hydrogen atoms are replaced with a halogen atom.

8. The process according to claim 1, wherein the ink temperature is at least 10° C. higher than the substrate temperature.

9. The process according claim 1, wherein the crystallization agent is benzene, wherein three or more hydrogen atoms are replaced with a halogen atom.

* * * * *